(12) United States Patent
Karmaker et al.

(10) Patent No.: US 11,228,292 B2
(45) Date of Patent: Jan. 18, 2022

(54) DIVIDED AMPLIFIER

(71) Applicant: Qualcomm Incorporated, San Diego, CA (US)

(72) Inventors: Rahul Karmaker, San Diego, CA (US); Conor Donovan, San Diego, CA (US); Li-chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/560,660

(22) Filed: Sep. 4, 2019

(65) Prior Publication Data

US 2021/0067115 A1 Mar. 4, 2021

(51) Int. Cl.
*H03F 3/45* (2006.01)
*H04B 1/40* (2015.01)

(52) U.S. Cl.
CPC ........... *H03F 3/45264* (2013.01); *H04B 1/40* (2013.01); *H03F 2200/294* (2013.01); *H03F 2200/451* (2013.01); *H03F 2203/45172* (2013.01)

(58) Field of Classification Search
CPC .......... H03F 3/45264; H03F 2200/294; H03F 2200/451; H03F 2203/45172; H03B 1/40
See application file for complete search history.

(56) References Cited

U.S. PATENT DOCUMENTS 4,165,497 A * 8/1979 Irons ................ H01P 1/10
333/101
2019/0326859 A1* 10/2019 Abbas Mohamed Helmy ............
H03F 1/565

* cited by examiner

*Primary Examiner* — Ankur Jain
*Assistant Examiner* — Angelica M Perez
(74) *Attorney, Agent, or Firm* — Colby Nipper/Qualcomm

(57) ABSTRACT

An apparatus is disclosed for processing a signal with a divided amplifier. In example implementations, an apparatus includes a first portion of an amplifier, a first port interface, a second port interface, and a switch matrix. The first port interface includes a first transformer; a second portion of the amplifier, which is coupled to the first transformer; and a first switch component that is coupled to at least one of the first transformer or the second portion of the amplifier. The second port interface includes a second transformer and a second switch component that is coupled to the second transformer. The switch matrix is coupled between the first switch component and the first portion of the amplifier and between the second switch component and the first portion of the amplifier. The switch matrix is also coupled between the second portion of the amplifier and the first portion of the amplifier.

30 Claims, 12 Drawing Sheets

DIVIDED AMPLIFIER

TECHNICAL FIELD

This disclosure relates generally to communications or signal processing with electronic devices and, more specifically, to implementing an amplifier that is divided by a switch matrix.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, robotics, automotive electronics, thermostats and other sensors or automated controllers, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet, a Wi-Fi network. or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, ordering a good or service like a car ride, and so forth.

To provide these and other types of services, electronic devices typically use a wireless transceiver to communicate wireless signals in accordance with some wireless standard. Examples of wireless standards include an IEEE 802.11b or 802.11g Wi-Fi standard and a Fourth Generation (4G) cellular standard, both of which are used today with smartphones and other connected devices. However, efforts to enable faster wireless networks through the creation of newer wireless standards are ongoing. Next-generation cellular networks and new Wi-Fi networks, for example, are expected to offer significantly higher bandwidths, lower latencies, and access to additional electromagnetic spectrum. Taken together, this means that exciting new wireless services can be provided to users, such as self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smart phones will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. Further, to enable next-generation wireless technologies, Fifth Generation (5G) cellular wireless devices, Wi-Fi 6 devices, and devices adhering to Licensed Assisted Access (LAA) schemes will each be communicating with signals that use wider frequency ranges that are located at higher frequencies of the electromagnetic (EM) spectrum as compared to those devices that operate in accordance with older wireless standards. For example, newer devices will be expected to provide channel bandwidths over 20 Megahertz (MHz) and to operate at millimeter wave (mmW) frequencies. These "mmW frequencies" can include frequencies between at least 30 and 300 Gigahertz (GHz), but they also include 20 GHz frequency and frequencies as low as 3-6 GHz. A version of LAA that is promulgated by the 3rd Generation Partnership Project (3GPP), for example, operates in a 5 GHz band.

To accommodate these commercial expectations and surmount the associated technical hurdles, the components that enable wireless communications under these constraints will be expected to operate efficiently at higher frequencies. One component that facilitates electronic communication is the wireless interface device, which can include a transceiver and a radio-frequency front-end (RFFE) for communicating with wireless signals. However, the wireless interface devices designed for electronic devices that operate in accordance with the Wi-Fi and 4G cellular standards of today are not adequate for the faster Wi-Fi 6, LAA, and 5G-capable devices of tomorrow because such devices will confront higher frequencies, more-stringent latency demands, and tighter fiscal constraints.

Consequently, to facilitate the adoption of newer and faster wireless technologies, as well as the widespread deployment of wireless interface devices that can provide new capabilities and services, wireless interface devices will be deployed having designs that can handle wider channel bandwidths and higher frequencies, including mmW frequencies. Electrical engineers and other designers of electronic devices are therefore striving to develop new wireless interface devices that will enable the promise of Wi-Fi 6, LAA, 5G and other higher-bandwidth and higher-frequency technologies to become a reality.

SUMMARY

The developing wireless standards for Wi-Fi 6 networks and Licensed Assisted Access (LAA) or 5G wireless communications are intended to establish broadband capabilities at higher frequencies in the gigahertz (GHz) range, including wireless communications providing broader channel bandwidths using frequencies of more than 3 GHz. To facilitate wireless communications at higher bandwidths, some electronic devices employ carrier aggregation. Due to a desire to utilize available frequency spectrum or because of frequency-licensing constraints, some wireless electronic devices employ noncontiguous carrier aggregation (NCCA).

NCCA involves combining carriers that are not adjacent to one another on the electromagnetic (EM) frequency spectrum to obtain a wider total bandwidth.

Generally, a broadband component of a device can handle signals having a wider frequency range as compared to a narrowband component. Consequently, fewer broadband components can be used to cover a given frequency range, and using fewer broadband components can result in more compact circuitries to thereby enable smaller electronic devices. Circuitries that include an EM component, such as a transformer, are sometimes realized as narrowband components relative to those that do not include an EM component. If narrowband components and broadband components are both utilized along a component chain for signal processing, there may be a greater quantity of the narrowband components than of the broadband components. This can occur because one broadband component can cover a broadband frequency range corresponding to a combination of multiple narrowband frequency ranges.

In example implementations, a receive chain includes one or more port interfaces and at least one downlink pipe (DLP). Each port interface includes a transformer, which may be a narrowband component. Each DLP includes, for example, a low-noise amplifier (LNA), a mixer, a filter, and so forth. Accordingly, the port interfaces can outnumber the DLPs if the DLPs are realized using broadband components. To couple a selected port interface of multiple port interfaces to an individual DLP of multiple DLPs, a switch matrix is deployed between the multiple port interfaces and the multiple DLPs. Signals propagating across the switch matrix are attenuated to some degree. This signal attenuation is typically frequency dependent. The attenuation can be greater, for instance, for relatively higher frequency signals as compared to relatively lower frequency signals.

To counteract the amplitude attenuation caused by a switch matrix, a signal, such as a higher frequency signal, can be amplified prior to propagation across the switch matrix. In a receive chain context, if a second LNA were to be employed for this prior amplification, the receive chain would include several additional components to accommodate the second LNA. These additional components could include another EM element, an impedance-matching component, an alternating-current (AC) coupling capacitor, and an additional bias circuit. The second LNA would also use additional current. Further, employing two LNAs introduces appreciable nonlinearity that can adversely impact the processing of signals.

In contrast, instead of using two separate LNAs, described implementations utilize a divided amplifier to counteract the attenuation experienced by signals traversing a switch matrix. Example implementations employ an amplifier that can include multiple portions (e.g., stages) that are divided by a switch matrix. In some scenarios, the amplifier can operate like an LNA as part of a receive chain. As part of a receive chain, a first portion of the amplifier is on one side of the switch matrix—e.g., on a communications-processor side of the switch matrix. A second portion of the amplifier is on another side of the switch matrix—e.g., on an antenna side of the switch matrix. A divided amplifier can operate as a multi-stage amplifier in which a main stage is realized as the second portion of the amplifier and a cascode stage is realized as the first portion of the amplifier.

In some implementations, multiple port interfaces are coupled to multiple downlink pipes (DLPs) via a switch matrix. The multiple port interfaces and the multiple DLPs facilitate the processing of signals having different carrier frequencies to support NCCA. A first portion of an amplifier can be included as part of a DLP. The first portion amplifies a signal after the signal propagates over the switch matrix but prior to the signal being applied downstream to a mixer of the DLP. A second portion of the amplifier can be incorporated as part of a first port interface that includes a first transformer and a first switch component. To activate the first port interface to process a received signal, the first switch component is engaged to enable the second portion of the amplifier to amplify the received signal "prior" to forwarding the received signal. This "partially-amplified" signal is then forwarded across the switch matrix to the first portion of the amplifier. The first portion of the amplifier further amplifies the partially-amplified signal before providing the amplified signal to the mixer.

With a cascode amplifier arrangement, for instance, a same current can be used for both the first and second portions of the amplifier. For lower-frequency signals that traverse the switch matrix without appreciable attenuation, the second portion of the amplifier can be omitted from a port interface that corresponds to the lower frequency band. Thus, a second port interface can include a second transformer and a second switch component that selectively permits a signal coupled to the second port interface to be passed to the switch matrix without prior amplification by the amplifier. Two-stage amplification provided by a divided amplifier can therefore be selectively instituted based on a frequency of a received signal.

Thus, employing an amplifier that is divided by a switch matrix across a port interface and a DLP can facilitate use of NCCA while obviating usage of a second LNA. The signal attenuation of higher-frequency signals that occurs as such signals propagate over the switch matrix is compensated for by the divided amplifier. By avoiding use of a second LNA to address the signal attenuation caused by a switch matrix, an additional EM element, an additional impedance-matching component, an additional AC-coupling capacitor, and an additional bias circuit can be avoided. The non-linearity introduced by using two LNAs in series is also avoided. Further, employing certain implementations described herein can save power by reducing current usage. For example, a multi-stage cascode amplifier can use a same current that flows between two power distribution nodes (e.g., between a supply voltage node and a ground node) and also flows through different stages, or portions, of the amplifier.

In an example aspect, an apparatus for processing a signal is disclosed. The apparatus includes a first portion of an amplifier. The apparatus also includes a first port interface. The first port interface includes a first transformer and a second portion of the amplifier, with the second portion of the amplifier coupled to the first transformer. The first port interface also includes a first switch component coupled to at least one of the first transformer or the second portion of the amplifier. The apparatus additionally includes a second port interface. The second port interface includes a second transformer and a second switch component coupled to the second transformer. The apparatus further includes a switch matrix. The switch matrix is coupled between the first switch component and the first portion of the amplifier. The switch matrix is also coupled between the second switch component and the first portion of the amplifier. The switch matrix is further coupled between the second portion of the amplifier and the first portion of the amplifier.

In an example aspect, an apparatus for processing a signal is disclosed. The apparatus includes first amplification means for amplifying a signal. The apparatus also includes a first port interface that includes a first transformer. The first port interface also includes second amplification means for amplifying the signal, with the second amplification means coupled to the first transformer. The first port interface further includes first activation means for activating the first port interface. The apparatus additionally includes a second port interface that includes a second transformer. The second port interface also includes second activation means for activating the second port interface. The apparatus further includes matrix means for providing signal paths that couple the first port interface and the second port interface to the first amplification means.

In an example aspect, a method for processing signals is disclosed. The method entails, for instance, operating a divided amplifier. The method includes accepting a first signal at a first transformer and routing the first signal from the first transformer to a second portion of an amplifier. The method also includes engaging a first switch component that is coupled to at least one of the first transformer or the second portion of the amplifier. Responsive to the engaging, the method additionally includes amplifying, by the second portion of the amplifier, the first signal to produce a partially-amplified signal. The method also includes routing the partially-amplified signal from the second portion of the amplifier, over a first signal path of a switch matrix, to a first portion of the amplifier. The method further includes amplifying, by the first portion of the amplifier, the partially-amplified signal to produce an amplified signal.

In an example aspect, an apparatus for processing a signal is disclosed. The apparatus includes multiple downlink pipes, with each respective downlink pipe of the multiple downlink pipes respectively comprising a first portion of an amplifier. The apparatus also includes a first port interface, which includes a first transformer. The first port interface also includes a second portion of a respective amplifier of a downlink pipe of the multiple downlink pipes, with the second portion of the respective amplifier coupled to the first transformer, and a first switch component coupled to the second portion of the respective amplifier. The first port interface further includes another second portion of another respective amplifier of another downlink pipe of the multiple downlink pipes, with the other second portion of the other respective amplifier coupled to the first transformer, and another first switch component coupled to the other second portion of the other respective amplifier. The apparatus further includes a switch matrix. The switch matrix couples the second portion of the respective amplifier to the first portion of the respective amplifier of the downlink pipe of the multiple downlink pipes. The switch matrix also couples the other second portion of the other respective amplifier to the first portion of the other respective amplifier of the other downlink pipe of the multiple downlink pipes.

BRIEF DESCRIPTION OF DRAWINGS

FIG. 3-1 illustrates an example receive chain including multiple port interfaces and multiple downlink pipes (DLPs), which are coupled together via a switch matrix, along with an amplifier that is divided by the switch matrix.

FIG. 3-2 illustrates the example receive chain of FIG. 3-1 and depicts example amplifier linkages for multiple divided amplifier configurations.

DETAILED DESCRIPTION

Figure 1:
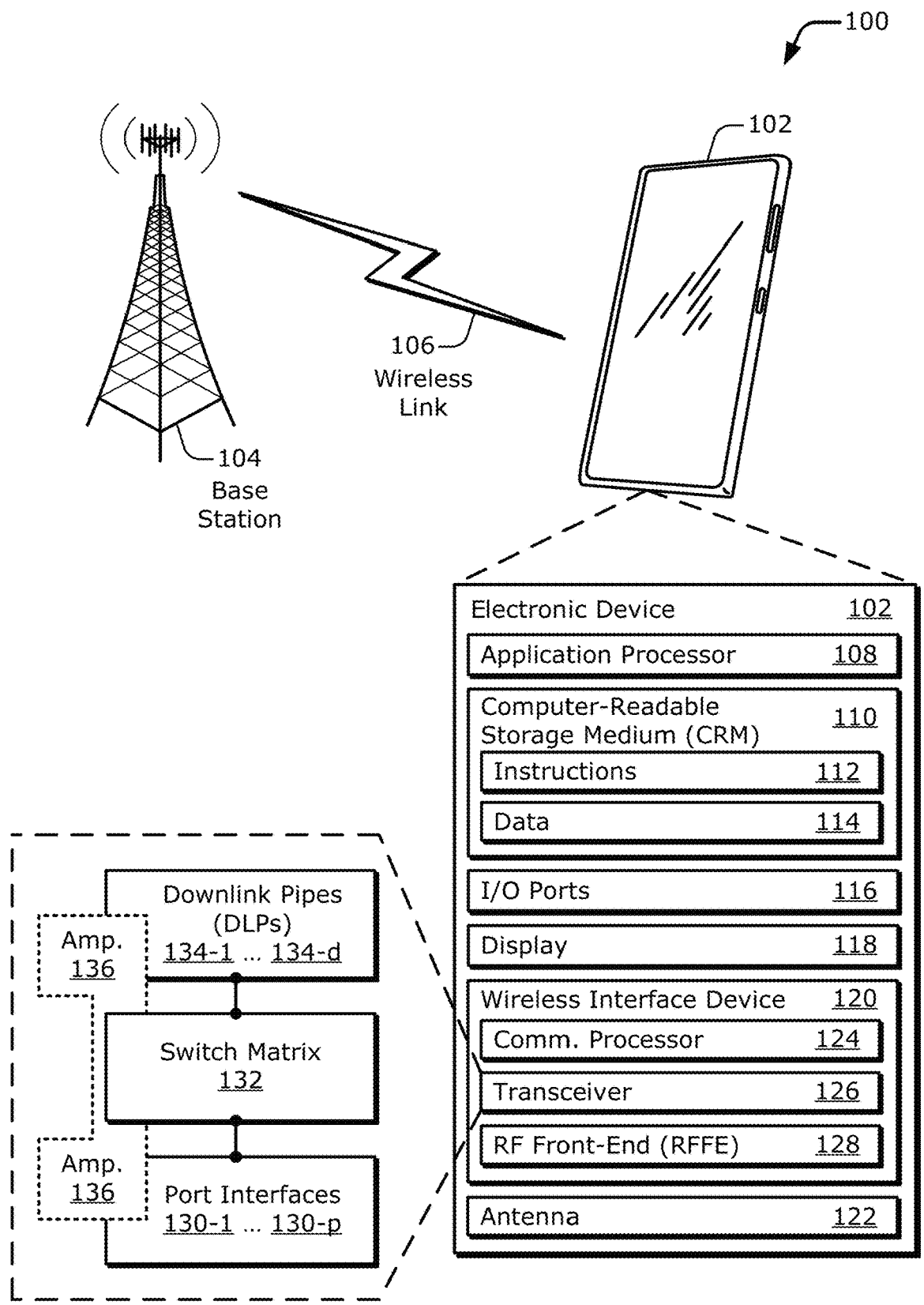
FIG. 1 illustrates an environment depicting an example electronic device having a wireless interface device including a transceiver with a divided amplifier.

The developing wireless standards for Wi-Fi 6 networks and Licensed Assisted Access (LAA) or 5G wireless communications are intended to establish broadband capabilities at higher frequencies in the gigahertz (GHz) range, including signals with frequencies of more than 3 GHz. To facilitate wireless communications at higher bandwidths, some electronic devices employ carrier aggregation. With carrier aggregation, an electronic device can obtain a higher total bandwidth by combining carrier bandwidths from multiple different carriers. For example, five (5) carriers having 20 MHz of bandwidth per-carrier can be combined to obtain 100 MHz of total bandwidth for an electronic device.

Contiguous carrier aggregation (CCA) involves combining carriers that are adjacent to each other on the electromagnetic (EM) frequency spectrum. Non-contiguous carrier aggregation (NCCA) involves combining carriers that are not adjacent to one another on the EM frequency spectrum. Generally, CCA is simpler or can be accomplished with fewer components because two or more adjacent carriers may be capable of being processed together with one component chain. Employing NCCA, on the other hand, is less simple or may entail using more components so that each can be individually tailored for a different carrier frequency. In other words, each carrier may be processed using a respective component chain with NCCA. Although NCCA is more complex to implement than CCA, NCCA offers more flexibility from a frequency utilization perspective. Further, some wireless service providers are limited to particular frequency ranges due to regulatory requirements or those frequency licenses that have been obtained by the service provider. Thus, to achieve a desired total frequency bandwidth using carrier aggregation, certain situations may necessitate relying on NCCA instead of CCA.

In some electronic device implementations, wireless signals are received via at least one antenna and routed to a receive chain including one or more port interfaces and at least one downlink pipe (DLP). The signal processing proceeds from a port interface to a DLP. A quantity of port interfaces can be greater than a quantity of DLPs to process a given set of carriers, including noncontiguous carriers, due to the usage of narrowband versus broadband components. For a set of noncontiguous carriers being received, a different DLP can be assigned to each carrier of the set of noncontiguous carriers being aggregated. Each DLP includes, for example, a low-noise amplifier (LNA), a mixer, a filter, and so forth. These DLP components can be designed to handle a relatively wide frequency band using transistors, capacitors, and resistors. In contrast, each port interface for processing received carriers includes an electromagnetic element, such as a transformer, that is tuned for a relatively narrow frequency band. In other words, a wideband frequency range corresponding to one DLP can span multiple narrowband frequency ranges respectively corresponding to multiple port interfaces. Because of this, an electronic device may include fewer DLPs than port interfaces. By employing broadband DLPs, space can be conserved within an electronic device, but there may not be a one-to-one correspondence between port interfaces and DLPs.

To couple a selected port interface of multiple port interfaces to an individual DLP of multiple DLPs, a switch matrix is deployed between the multiple port interfaces and the multiple DLPs. Signals propagating across the switch matrix are attenuated to some degree. This signal attenuation is typically frequency dependent. The attenuation is greater, for instance, for relatively higher frequency signals as compared to relatively lower frequency signals. To combat the amplitude attenuation, a higher frequency signal can be amplified "prior" to propagation across the switch matrix.

This amplification could be performed using a second LNA that is part of a port interface in addition to an LNA included in a DLP. However, this second LNA involves use of an additional EM element, which occupies area of an integrated circuit (IC) and space within a chip module. The size of the EM element appreciably increases costs. The second LNA also involves an additional impedance-matching component, an additional alternating-current (AC) coupling capacitor, and an additional bias circuit. Further, the second LNA uses additional current, which consumes power, including in portable battery-powered devices with limited power. Moreover, employing two LNAs introduces appreciable nonlinearity that can adversely impact the signal processing or involve still more circuitry to counteract the nonlinearity.

In contrast, example implementations that are described herein employ an amplifier that can include multiple portions (e.g., stages) that are divided by a switch matrix. In a receive chain context, the amplifier can operate like an LNA as part of a receive chain. A first portion of the amplifier is coupled to one side of the switch matrix—e.g., on a communication-processor side of the switch matrix. A second portion of the amplifier is coupled to another side of the switch matrix—e.g., on an antenna-side of the switch matrix. This divided amplifier can operate as a multi-stage amplifier in which a main stage is realized as the second portion of the amplifier and a cascode stage is realized as the first portion of the amplifier.

In some implementations, a first portion of the amplifier can be included as part of a DLP, and the first portion can amplify a signal before the amplified signal is applied downstream to a mixer of the DLP. A second portion of the amplifier can be incorporated as part of a first port interface that includes a first transformer and a first switch component. To activate the first port interface to process a received signal, the first switch component enables the second portion of the amplifier to amplify the signal "prior" to forwarding the signal over the switch matrix. The second portion of the amplifier amplifies the received signal to produce a "partially-amplified" signal that is forwarded across the switch matrix to the first portion of the amplifier. The first portion of the amplifier further amplifies the partially-amplified signal before providing the amplified signal to the mixer.

With a cascode amplifier arrangement, for instance, a same current can be used for both the first and second portions of the amplifier to save power. For lower-frequency signals that traverse the switch matrix without appreciable attenuation, the second portion of the amplifier can be omitted from a port interface that corresponds to the lower frequency band. Thus, a second port interface can include a second transformer and a second switch component that selectively permits a signal coupled to the second port to be passed to the switch matrix without amplification by the amplifier prior to propagation across the switch matrix. Two-stage amplification provided by a divided amplifier can therefore be selectively instituted based on a frequency of a received signal.

Thus, employing an amplifier that is divided by a switch matrix across a port interface and a DLP can facilitate use of non-contiguous carrier aggregation (NCCA) while obviating usage of a second LNA. The signal attenuation of higher-frequency signals that occurs as such signals propagate over the switch matrix is compensated for by the divided amplifier. By avoiding use of a second LNA, an additional EM element, an additional impedance-matching component, an additional AC-coupling capacitor, and an additional bias circuit can be avoided. The non-linearity that would be introduced by using two LNAs in series is also avoided. Further, employing certain implementations described herein can save power by reducing current usage. For example, a multi-stage cascode amplifier can use a same current that flows between two power distribution nodes (e.g., between a supply voltage node and a ground node) and also flows through different stages, or portions, of the amplifier.

FIG. 1 illustrates an example environment 100 depicting an electronic device 102 having a wireless interface device 120 including a transceiver 126 with a divided amplifier. As depicted in FIG. 1, an amplifier 136 can be divided by a switch matrix 132. In the environment 100, the example electronic device 102 communicates with a base station 104 through a wireless link 106. In FIG. 1, the electronic device 102 is depicted as a smartphone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smart watch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project Long-Term Evolution (3GPP LTE) standard, such as a Fourth Generation (4G) or a Fifth Generation (5G) cellular standard; an IEEE 802.11 standard, such as 802.11g, ac, ax, ad, aj, or ay standard; an IEEE 802.16 standard (e.g., WiMAX™); a Bluetooth™ standard; and so forth. In some implementations, the wireless link 106 may wirelessly provide power, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122, which are coupled one to another. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 using the wireless interface device 120. However, the electronic device 102 may communicate directly with other peer devices, an alternative wireless network, and the like.

As shown, the wireless interface device 120 includes at least one communication processor 124, at least one transceiver 126, and at least one RF front-end 128 (RFFE 128). The communication processor 124 can be coupled to the transceiver 126, and the transceiver 126 can be coupled to the RF front-end 128, which is coupled to the antenna 122. These components process data information, control information, and signals associated with communicating information for the electronic device 102 via the antenna 122. The communication processor 124 may be implemented as part of a system-on-chip (SoC), as a modem baseband processor, or as a baseband radio processor (BBP) that realizes a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118. This operable coupling enables control of, or other interaction with, the other components of the electronic device 102. Additionally, the communication processor 124 may also include a memory (not separately shown), such as a CRM 110, to store data and processor-executable instructions (e.g., code). The various components illustrated in FIG. 1 using separate schematic blocks may be manufactured or packaged in different discrete manners. For example, one physical module may include components of the RF front-end 128 and some components of the transceiver 126, and another physical module may combine the communication processor 124 with the remaining components of the transceiver 126. Further, an antenna 122 may be co-packaged with at least some components of an RF front-end 128.

The transceiver 126 includes circuitry and logic for filtering, amplification, channelization, and frequency translation. The frequency translation may include an up-conversion or a down-conversion of frequency that is performed in a single conversion operation (e.g., with a direct-conversion architecture) or through multiple conversion operations (e.g., with a superheterodyne architecture) using one or more mixers. Thus, the transceiver 126 can include filters, switches, amplifiers, mixers, and so forth for routing and conditioning signals that are transmitted or received via the antenna 122. Although not explicitly shown, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

Configurable components of the transceiver 126, such as an amplifier, may be controlled by the communication processor 124 to implement communications in various modes, with different frequency bands, or to comport with a particular wireless standard. The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., to implement separate transmit and receive chains). The transceiver 126 may also include logic to perform in-phase/quadrature (I/Q) operations, such as synthesis, phase correction, modulation, demodulation, and the like.

Generally, the RF front-end 128 includes one or more filters, switches, amplifiers, or phase shifters for conditioning signals received via the antenna 122 or signals to be transmitted via the antenna 122. The RF front-end 128 may also include other RF sensors and components, such as a peak detector, power meter, gain control block, antenna tuning circuit, diplexer, balun, and the like. Configurable components of the RF front-end 128, such as a phase shifter, may be controlled by the communication processor 124 to implement communications in various modes, with different frequency bands, or using beamforming. The RF front-end 128 is coupled to the antenna 122. The antenna 122 can be implemented as at least one antenna or as at least one antenna array that include multiple antenna elements. Thus, as used herein, an "antenna" can refer to a single antenna, an antenna array, or an antenna element of an antenna array, depending on context.

In example implementations, the transceiver 126 includes at least one port interface 130, at least one switch matrix 132, at least one downlink pipe 134 (DLP 134), and at least one amplifier 136. More specifically, the transceiver 126 can include multiple port interfaces 130-1 . . . 130-$p$, with "p" representing some positive integer, and multiple downlink pipes 134-1 . . . 134-$d$, with "d" representing some positive integer. The variables "p" and "d" may correspond to a same integer or to different integers. In some cases, the variable "p" is larger than the variable "d" if the multiple port interfaces 130-1 . . . 130-$p$ are more numerous than the multiple downlink pipes 134-1 . . . 134-$d$.

As shown for certain implementations, the switch matrix 132 couples the multiple port interfaces 130-1 . . . 130-$p$ to the multiple downlink pipes 134-1 . . . 134-$d$. The amplifier 136 can be divided by the switch matrix 132. For example, respective portions of the amplifier 136 can be included as part of the multiple port interfaces 130-1 . . . 130-$p$ and as part of the multiple downlink pipes 134-1 . . . 134-$d$. Although the multiple port interfaces 130-1 . . . 130-$p$, the switch matrix 132, the multiple downlink pipes 134-1 . . . 134-$d$, and the amplifier 136 are depicted as being part of a transceiver 126, described implementations of a divided amplifier can alternatively be employed fully or partially in other portions of the wireless interface device 120 (e.g., in the RF front-end 128). An amplifier 136 that is divided by a switch matrix 132 can also be implemented in other parts of the electronic device 102 generally, such as anywhere a switch matrix may cause a nonacceptable level of attenuation. Example implementations of a wireless interface device 120, including aspects of the transceiver 126, are described below starting with FIG. 2.

Figure 2:
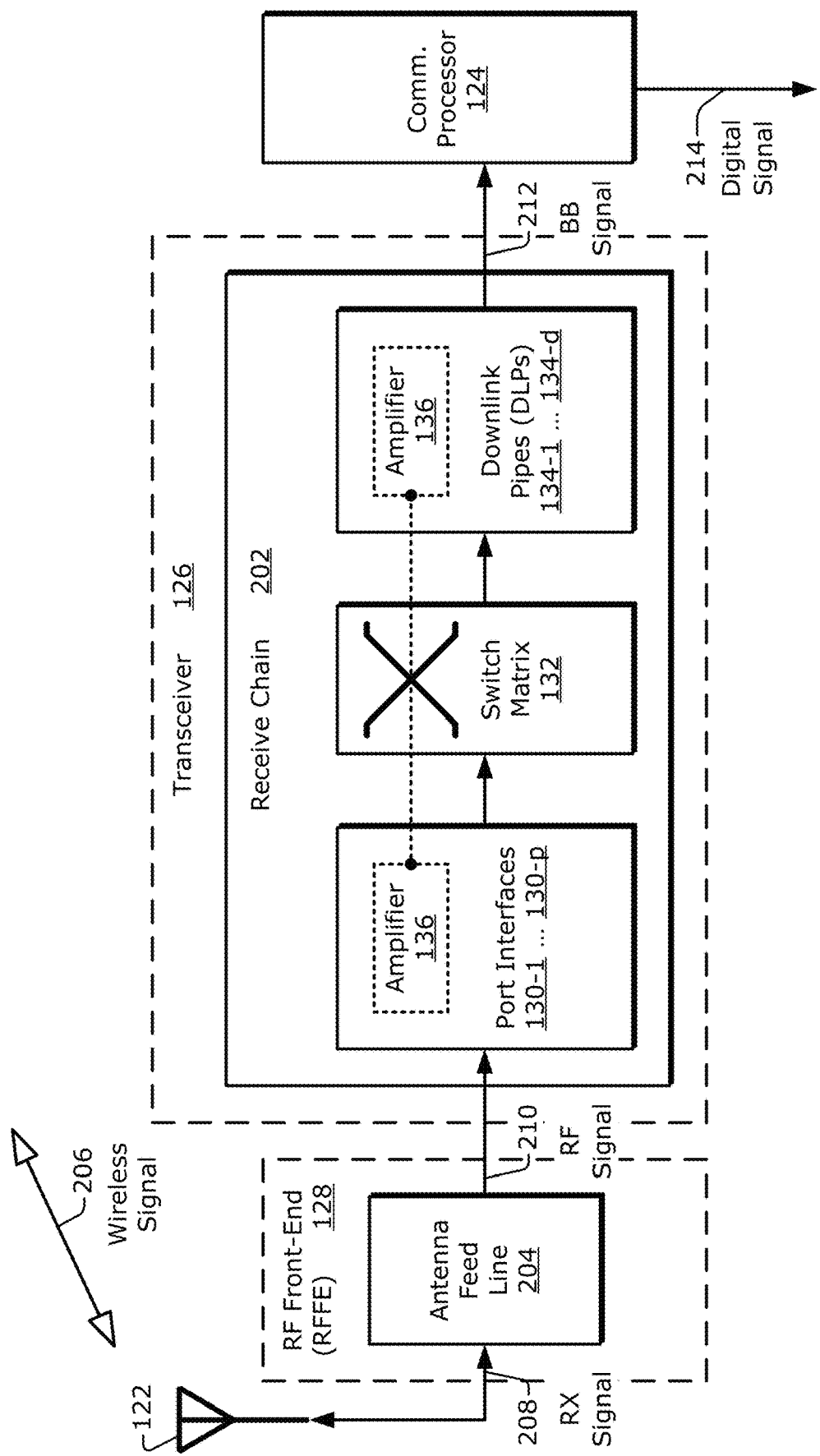
FIG. 2 illustrates an example transceiver with a receive chain including an example amplifier that is divided by a switch matrix.

FIG. 2 illustrates, generally at 200, an example transceiver 126 with a receive chain 202 including an example amplifier 136 that is divided by a switch matrix 132. As shown, the receive chain 202 also includes multiple port interfaces 130-1 . . . 130-$p$ and multiple downlink pipes 134-1 . . . 134-$d$. FIG. 2 also illustrates an antenna 122, an RF front-end 128, and a communication processor 124. The RF front-end 128 includes an antenna feed line 204. The antenna 122 is coupled to the antenna feed line 204, and the antenna feed line 204 is coupled to the receive chain 202 of the transceiver 126. The receive chain 202 is coupled to the communication processor 124. Although the receive chain 202 is depicted as being contained within the transceiver 126, the receive chain 202 can alternatively extend into the RF front-end 128 or the communication processor 124. The receive chain 202, including a divided amplifier thereof, can also be distributed across two or more physical modules.

For the receive chain 202, the antenna feed line 204 is coupled to the multiple port interfaces 130-1 . . . 130-$p$, and the multiple port interfaces 130-1 . . . 130-$p$ are coupled to the switch matrix 132. The switch matrix 132 is coupled to the multiple downlink pipes 134-1 . . . 134-$d$, and the multiple downlink pipes 134-1 . . . 134-$d$ are coupled to the communication processor 124. Although not explicitly shown, the communication processor 124 can be coupled to other components of the electronic device 102 of FIG. 1, such as the application processor 108, the CRM 110, or the display 118.

An example signal flow direction for processing a received signal proceeds from left to right between the antenna 122 and the communication processor 124. In operation, the antenna 122 emanates for transmission or senses for reception at least one wireless signal 206. For reception, the antenna 122 receives the wireless signal 206 and provides a received signal 208 (RX signal 208) to the antenna feed line 204 of the RF front-end 128. The antenna feed line 204 propagates a signal between the antenna 122 and the transceiver 126. Thus, the RF front-end 128 couples the antenna 122 to the transceiver 126 via the antenna feed line 204. During or as part of the propagation, the antenna feed line 204 conditions the propagating signal. This enables the RF front-end 128 to couple the receive signal 208 from the antenna 122 to the transceiver 126 as an RF signal 210 as part of a reception operation. The RF front-end 128 also enables a transmission signal to be coupled from the transceiver 126 to the antenna 122 as part of a transmission operation to emanate a wireless signal 206. Although not explicitly shown in FIG. 2, an RF front-end 128, or an antenna feed line 204 thereof, may include one or more other components, such as a filter, an amplifier, an N-plexer, and so forth.

The multiple port interfaces 130-1 . . . 130-$p$ can accept the RF signal 210 from the RF front-end 128. One or more of the multiple port interfaces 130-1 . . . 130-$p$ can provide the RF signal 210 to at least one downlink pipe 134 of the multiple downlink pipes 134-1 . . . 134-$d$ via the at least one switch matrix 132. The at least one downlink pipe 134 includes at least a portion of the amplifier 136. The amplifier 136 can operate as a low-noise amplifier (LNA) for the receive chain 202. After frequency down-conversion in one or more steps by at least one mixer of the downlink pipe 134, the downlink pipe 134 forwards a baseband signal 212 (BB signal 212) to the communication processor 124. After digital processing, the communication processor 124 provides a digital signal 214 for use or further processing by the electronic device 102. Although depicted and described in a particular order, the illustrated components may be implemented in different orders. Also, the amplifier 136 can be implemented with other components, such as with a transmit chain (not explicitly shown).

In some implementations, a portion of the amplifier 136 operates as part of a downlink pipe 134. Another portion of the amplifier 136 can operate as part of a port interface 130. These two portions are separated by the switch matrix 132. As described herein, the multiple portions can interoperate in combination as a single amplifier across the switch matrix 132 as part of the receive chain 202. For example, the multiple portions can operate as multiple stages of an amplifier 136. An example receive chain 202 is described next with reference to FIGS. 3-1 and 3-2.

Figures 1, 3:
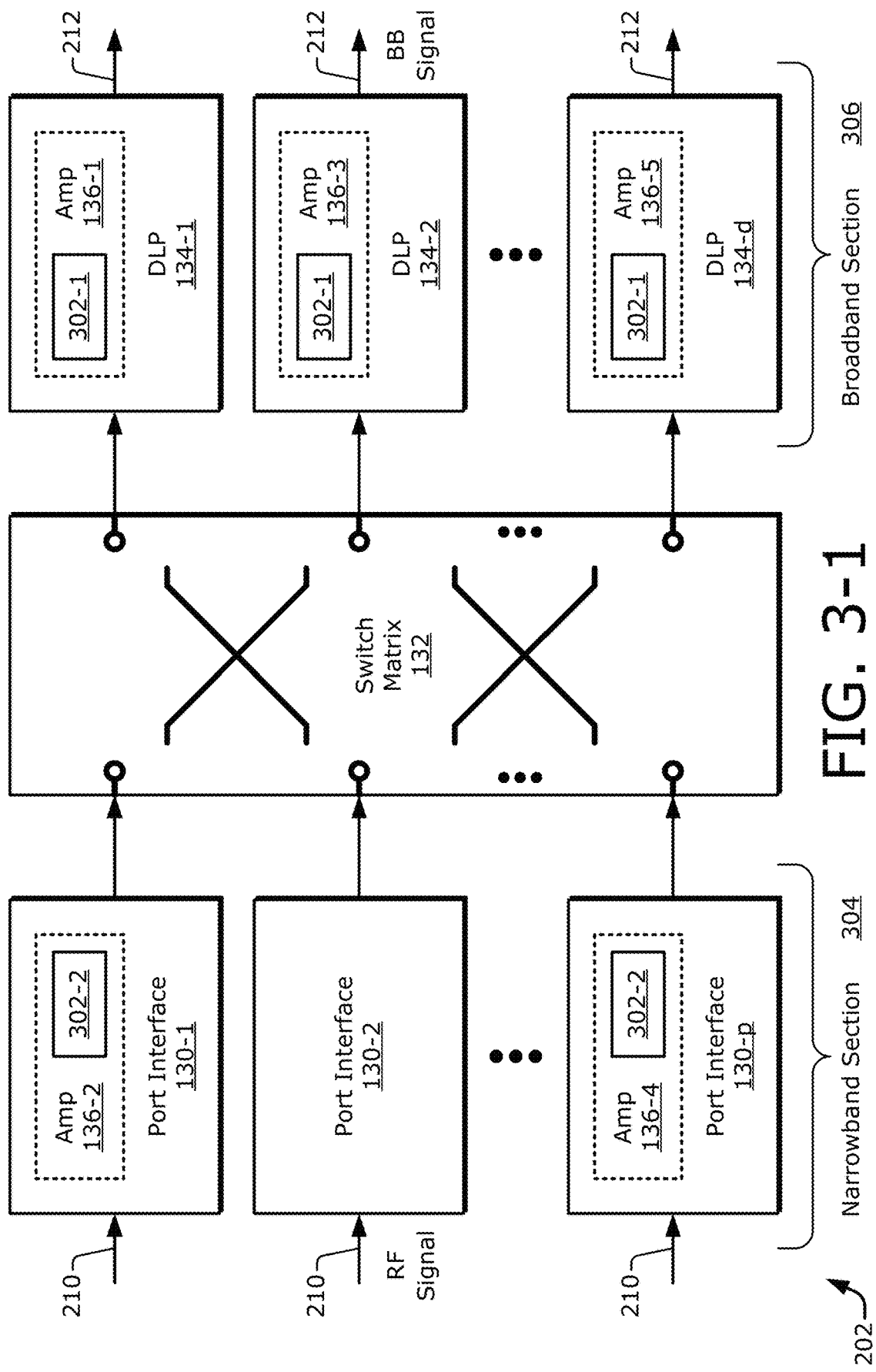
Figures 2, 3:
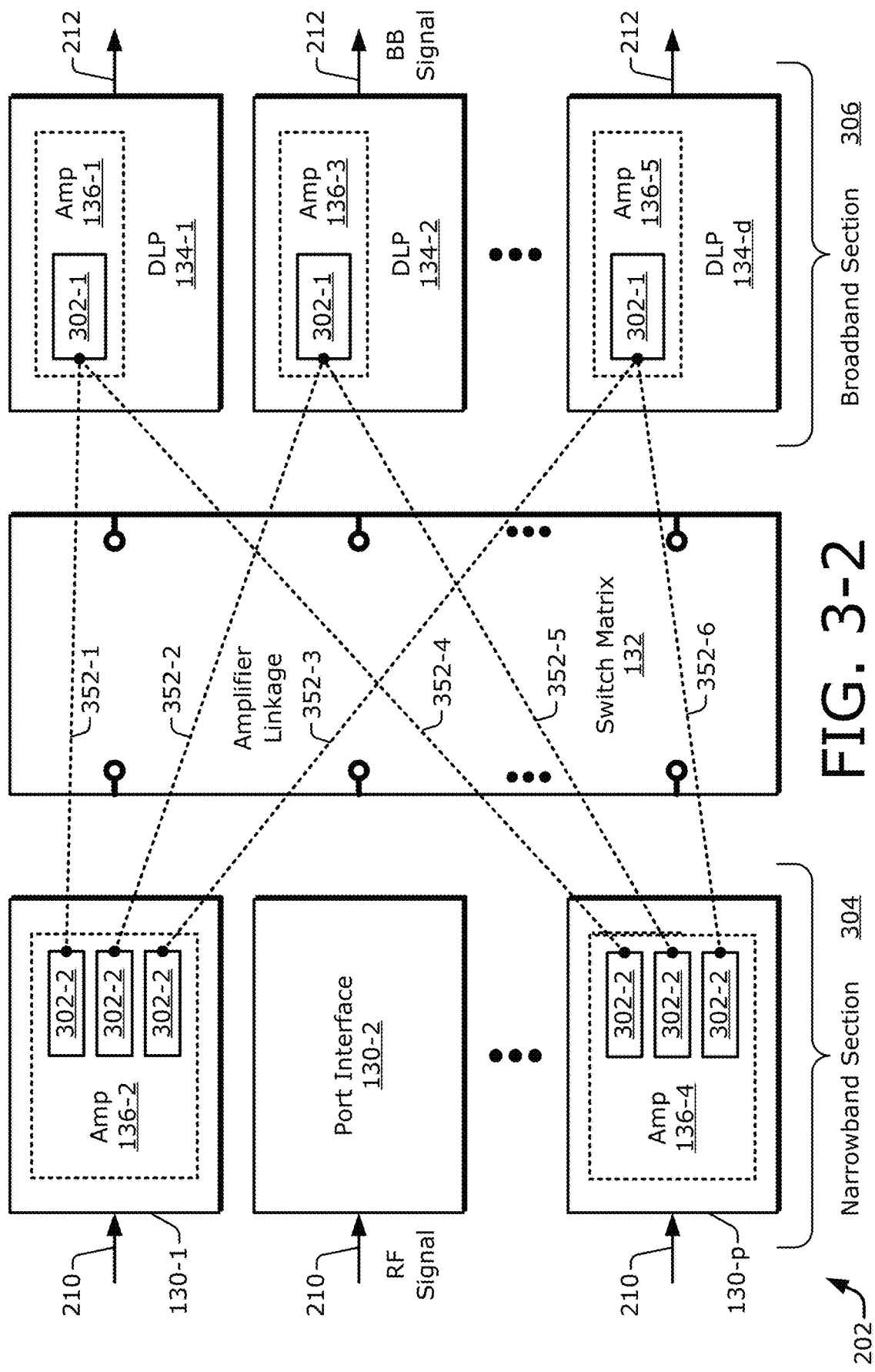

FIG. 3-1 illustrates an example receive chain 202 including multiple port interfaces 130-1 . . . 130-p and multiple downlink pipes 134-1 . . . 134-d, which are coupled together via a switch matrix 132. The receive chain 202 also includes at least one amplifier 136 that is divided by the switch matrix 132 into multiple portions 302-1 and 302-2. As described below, any individual first portion 302-1 can be switchably coupled to a particular second portion 302-2 to realize an instance of a divided amplifier. As shown, the receive chain 202 accepts as input at least one RF signal 210 and provides as output at least one baseband signal 212.

In some implementations, the receive chain 202 includes a narrowband section 304 and a broadband section 306. The narrowband section 304 includes multiple port interfaces 130-1, 130-2 . . . 130-p. The broadband section 306 includes multiple downlink pipes 134-1, 134-2 . . . 134-d. The bandwidths of associated frequency bands of these interfaces and pipes are described further below with reference to FIG. 4.

Each instance of an amplifier 136 includes at least one portion 302. The amplifier 136 can also selectively include multiple portions 302-1 or 302-2. Although only one or two portions 302 are shown, an amplifier 136 may alternatively include more than two portions 302 (e.g., that are arranged in more than two stages). For clarity of description, each instance of an illustrated portion 302-1 or 302-2 of an amplifier 136 is individually indicated by a numerical suffix after a dash (e.g., "-X") in FIGS. 3-1, 3-2, and 4. In FIG. 3-1, five different portion instances are shown as represented by an amplifier 136-1, an amplifier 136-2, an amplifier 136-3, an amplifier 136-4, and an amplifier 136-5. As illustrated, a first downlink pipe 134-1 includes the amplifier 136-1, a second downlink pipe 134-2 includes the amplifier 136-3, and a "dth" downlink pipe 134-d includes the amplifier 136-5. Also, a first port interface 130-1 includes the amplifier 136-2, and a "pth" port interface 130-p includes the amplifier 136-4.

Each downlink pipe 134 includes a first portion 302-1 of the amplifier 136. As shown, the first downlink pipe 134-1, the second downlink pipe 134-2, and the "dth" downlink pipe 134-d each include a different instance of the first portion 302-1 of an amplifier 136. At least one port interface 130 includes at least one second portion 302-2 of the amplifier 136. As shown, the first port interface 130-1 and the "pth" port interface 130-p each include a different instance of the second portion 302-2 of the amplifier 136. In contrast, a second port interface 130-2 omits, or does not include, a second portion 302-2 of the amplifier 136. Thus, each instance of the amplifier 136-1, 136-3, and 136-5 includes an instance of the first portion 302-1. Similarly, each instance of the amplifier 136-2 and 136-4 includes an instance of the second portion 302-2.

As described herein, a particular second portion 302-2 of a port interface 130 interoperates across the switch matrix 132 with an individual first portion 302-1 of a downlink pipe 134 to realize an example divided implementation of an amplifier 136. In such cases, the amplifier 136 can comprise a multi-stage amplifier, e.g.—a two-stage amplifier. However, an amplifier 136 can also be configured with fewer stages, e.g.—as a single-stage or a one-stage amplifier. For instance, if a signal is traversing the second port interface 130-2, a single-stage configuration of the amplifier 136 can be used to amplify the received signal (e.g., using a single-stage version of the amplifier 136-1, 136-3, or 136-5 alone). However, if a first portion 302-1 of an amplifier 136 of a given downlink pipe 134 includes multiple stages, a signal traversing the second port interface 130-2 is amplified over multiple stages (e.g., using a multistage version of the amplifier 136-1, 136-3, or 136-5 alone), but no amplification portion or stage is provided by the second port interface 130-2.

Each instance of a second portion 302-2 of the amplifier 136-2 or the amplifier 136-4 may be the same as or different from other instances of a second portion 302-2 of the amplifier 136-2 or 136-4 (or another second amplifier portion) of the multiple port interfaces 130-1 . . . 130-p. Similarly, each instance of a first portion 302-1 of the amplifier 136-1, the amplifier 136-3, or the amplifier 136-5 may be the same as or different from other instances of a first portion 302-1 of the amplifier 136-1, 136-3, or 136-5 (or another first amplifier portion) of the multiple downlink pipes 134-1 . . . 134-d. As described with reference to FIG. 4, each port interface 130 of the multiple port interfaces 130-1 . . . 130-p can be coupled to at least one downlink pipe 134 of the multiple downlink pipes 134-1 . . . 134-d via a signal path of the switch matrix 132. Moreover, in some implementations, each port interface 130 of the multiple port interfaces 130-1 . . . 130-p is coupled to multiple ones of the downlink pipes 134-1 . . . 134-d via a respective signal path of the switch matrix 132.

Also, as described with reference to FIG. 3-2, each port interface 130 that includes at least one instance of the second portion 302-2 (e.g., the first port interface 130-1 or the "pth" port interface 130-p as illustrated in FIG. 3-1) may include multiple instances of the second amplifier portion 302-2 of the amplifier 136. Further, each second amplifier portion 302-2 that is included as part of one of the multiple port interfaces 130-1 . . . 130-p can be linked to a first amplifier portion 302-1 that is included as part of one of the multiple downlink pipes 134-1 . . . 134-d via an amplifier linkage. Example amplifier linkages are described below with reference to FIG. 3-2.

In example implementations, an amplifier 136 may be configured in multiple different ways, depending on a state of the switch matrix 132 or a switch component that routes a signal over the switch matrix 132. In other words, with the multiple port interfaces 130-1 . . . 130-p and the multiple downlink pipes 134-1 . . . 134-d, an instance of an amplifier 136 can be realized in a myriad of different permutations and combinations. For example, an amplifier 136 may be realized as the first portion 302-1 of the amplifier 136-1, as the first portion 302-1 of the amplifier 136-3, or as the first portion 302-1 of the amplifier 136-5 without using a second portion, such as if a signal traverses the second port interface 130-2. In such cases, the amplifier 136 includes a quantity of stages provided by the corresponding first portion 302-1. In other examples, an amplifier 136 may be realized as a combination of a first portion 302-1 and a second portion 302-2. In such cases, the amplifier 136 includes a quantity of stages provided by a combination of the corresponding second portion 302-2 and the corresponding first portion 302-1. For instance, an amplifier 136 may be implemented as the first portion 302-1 of the amplifier 136-1 in combination with the second portion 302-2 of the amplifier 136-2 or as the first portion 302-1 of the amplifier 136-1 in combination with the second portion 302-2 of the amplifier 136-4. Alternatively, an amplifier 136 may be implemented as the first portion 302-1 of the amplifier 136-3 in combination with the second portion 302-2 of the amplifier 136-2 or as the first portion 302-1 of the amplifier 136-5 in combination with the second portion 302-2 of the amplifier 136-4.

Further, multiple ones of such amplifiers 136 can be simultaneously implemented, such as to facilitate noncontiguous carrier aggregation (NCCA). As an example, a first instance of an amplifier 136 (e.g., a first amplifier 136) may be implemented with the first portion 302-1 of the amplifier 136-1 in combination with the second portion 302-2 of the amplifier 136-2, and a second instance of an amplifier 136 (e.g., a second amplifier 136) may be implemented with the first portion 302-1 of the amplifier 136-5 in combination with the second portion 302-2 of the amplifier 136-4. In another NCCA scenario, one amplifier 136 may include both first and second portions 302-1 and 302-2 while another amplifier 136 includes a first portion 302-1 but not a second portion 302-2.

FIG. 3-2 illustrates the example receive chain 202 of FIG. 3-1 and depicts example amplifier linkages for multiple divided amplifier configurations. In some implementations, each second portion 302-2 of an amplifier 136 that is included as part of one of the multiple port interfaces 130-1 ... 130-p can be linked to a first portion 302-1 of the amplifier 136 that is included as part of one of the multiple downlink pipes 134-1 ... 134-d via an amplifier linkage 352. Each port interface 130 that includes at least one second portion 302-2 (e.g., the amplifier 136-2 of the first port interface 130-1 and the amplifier 136-4 of the "pth" port interface 130-p) is depicted as including three second portions. However, a given port interface 130 can include more or less than three second portions. For simplicity, these three second portions are referred to as a "top," a "middle," and a "bottom" second portion 302-2 with reference to FIG. 3-2.

In example implementations, a top second portion 302-2 of the amplifier 136-2 of the first port interface 130-1 is coupled to the first portion 302-1 of the amplifier 136-1 of the first downlink pipe 134-1 via an amplifier linkage 352-1. Similarly, a middle second portion 302-2 of the amplifier 136-2 of the first port interface 130-1 is coupled to the first portion 302-1 of the amplifier 136-3 of the second downlink pipe 134-2 via an amplifier linkage 352-2. Also, a bottom portion 302-2 of the amplifier 136-2 of the first port interface 130-1 is coupled to the first portion 302-1 of the amplifier 136-5 of the "dth" downlink pipe 134-d via an amplifier linkage 352-3.

An analogous set of amplifier linkages 352 is available to couple the amplifier 136-4 of the "pth" port interface 130-p to the amplifier 136-1, 136-3, or 136-5 of the multiple downlink pipes 134-1 ... 134-d. A top second portion 302-2 of the amplifier 136-4 of the "pth" port interface 130-p is coupled to the first portion 302-1 of the amplifier 136-1 of the first downlink pipe 134-1 via an amplifier linkage 352-4. If the amplifier linkage 352-4 is engaged, then the amplifier 136-4 and the amplifier 136-1 jointly realize a divided version of an amplifier 136. Similarly, a middle second portion 302-2 of the amplifier 136-4 of the "pth" port interface 130-p is coupled to the first portion 302-1 of the amplifier 136-3 of the second downlink pipe 134-2 via an amplifier linkage 352-5. If the amplifier linkage 352-5 is engaged, then the amplifier 136-4 and the amplifier 136-3 jointly realize a divided version of an amplifier 136. Also, a bottom second portion 302-2 of the amplifier 136-4 of the "pth" port interface 130-p is coupled to the first portion 302-1 of the amplifier 136-5 of the "dth" downlink pipe 134-d via an amplifier linkage 352-6. If the amplifier linkage 352-6 is engaged, then the amplifier 136-4 and the amplifier 136-5 jointly realize a divided version of an amplifier 136.

Thus, each second amplifier portion 302-2 that is included as part of one of the multiple port interfaces 130-1 ... 130-p can be linked to a first amplifier portion 302-1 that is included as part of one of the multiple downlink pipes 134-1 ... 134-d via an amplifier linkage 352 of the switch matrix 132. These amplifier linkages 352 can be realized using signal paths of the switch matrix 132 that are coupled to a given port interface 130 that is being activated to process a received RF signal 210. Activation of a port interface 130 is described below with reference to FIG. 6. Example signal paths of the switch matrix 132 that can realize the multiple amplifier linkages 352-1 to 352-6 are described next with reference to FIG. 4. Example signal paths of the switch matrix 132 that do not realize an amplifier linkage across the switch matrix 132 are also described next with regard to the second port interface 130-2.

Figure 4:
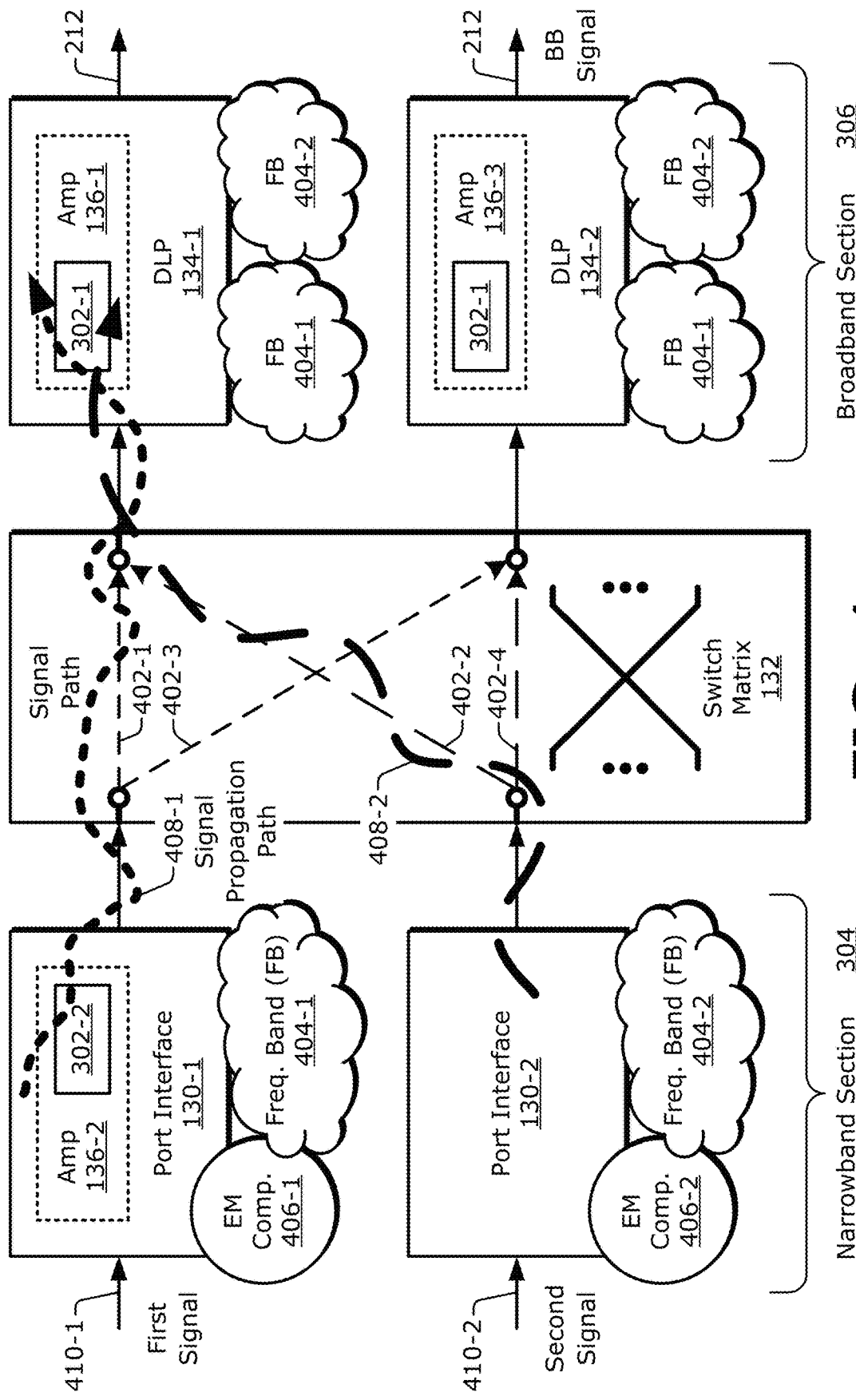
FIG. 4 illustrates another example receive chain including multiple port interfaces and multiple DLPs with regard to corresponding frequency ranges.

FIG. 4 illustrates another example receive chain 202 including multiple port interfaces 130-1 and 130-2 and multiple downlink pipes 134-1 and 134-2 with regard to corresponding frequency ranges. Each illustrated component can process signals within a particular frequency band 404 in a satisfactory manner, such as in a linear fashion or with acceptable attenuation. Each port interface 130 includes at least one electromagnetic component 406 (EM Comp. 406). An example of an EM component 406 is an inductor, a transformer, and so forth. This EM component 406 can establish or narrow a usable frequency band of the associated port interface 130. Specifically, the first port interface 130-1 includes a first EM component 406-1; consequently, the first port interface 130-1 corresponds to a first frequency band 404-1. Similarly, the second port interface 130-2 includes a second EM component 406-2; the second port interface 130-2 therefore corresponds to a second frequency band 404-2.

In certain implementations, the multiple port interfaces 130-1 ... 130-p (e.g., of FIGS. 3-1 and 3-2) are part of the narrowband section 304. Thus, each port interface 130 corresponds to a particular frequency band 404. If a received RF signal has a frequency within the second frequency band 404-2, for example, the second port interface 130-2 is activated to process the RF signal 210 and forward the RF signal across the switch matrix 132. In contrast, the multiple downlink pipes 134-1 ... 134-d (e.g., of FIGS. 3-1 and 3-2) are part of the broadband section 306. Each downlink pipe 134 can therefore process signals that are within multiple frequency bands corresponding to multiple ones of the port interfaces. For instance, both the first and second downlink pipes 134-1 and 134-2 can process signals that are within either the first frequency band 404-1 (FB 404-1) or the second frequency band 404-2 (FB 404-2).

Using a numerical example, the second frequency band 404-2 corresponds to 1.8 to 2.6 GHz, and the first frequency band 404-1 corresponds to 5.0 to 5.8 GHz. Each of the first and second port interfaces 130-1 and 130-2 is respectively activated to handle a signal having a frequency within the corresponding frequency band 404. On the other hand, both the first downlink pipe 134-1 and the second downlink pipe 134-2 can process a signal having a frequency within either frequency band after the signal traverses the switch matrix 132. Each downlink pipe 134 can process, for instance, signals having a frequency from 600 MHz to 6 GHz.

However, narrowband port interfaces or wideband downlink pipes can correspond to different frequency bands than those of this example.

To traverse the switch matrix 132, a signal propagates over a signal path 402. As shown, the switch matrix 132 includes multiple signal paths 402-1 to 402-4: a first signal path 402-1, a second signal path 402-2, a third signal path 402-3, a fourth signal path 402-4, and so forth. Although four signals paths 402-1 to 402-4 are explicitly depicted and described herein, a switch matrix 132 can include more or fewer such signal paths. Each signal path 402 comprises at least an electrical path (e.g., a metallic trace or wire) across the switch matrix 132, such as from an input of the switch matrix 132 to an output of the switch matrix 132. In these manners, the switch matrix 132 provides an example matrix mechanism for providing signal paths 402 that couple the first port interface 130-1 and the second port interface 130-2 to at least one instance of the first portion 302-1 of an amplifier 136, such as the amplifier 136-1 or the amplifier 136-3.

A signal path 402 may include, for instance, a first end and a second end that respectively correspond to the output and the input of the switch matrix 132. Each signal path 402 can include one or more switches along the path (e.g., to achieve a measure of isolation between the different sides of the switch). In some cases, different signal paths extend from each port interface 130 to multiple ones of the downlink pipes 134-1 and 134-2, and up to all available downlink pipes 134-1 . . . 134-$d$. For example, the first port interface 130-1 is coupled to the first downlink pipe 134-1 via the first signal path 402-1 and is coupled to the second downlink pipe 134-2 via the third signal path 402-3. The second port interface 130-2 is coupled to the first downlink pipe 134-1 via the second signal path 402-2 and is coupled to the second downlink pipe 134-2 via the fourth signal path 402-4.

With these couplings along the different signal paths 402-1 to 402-4, an amplifier 136 can be configured differently based on a frequency of a received signal. More specifically, an amplifier 136 can be configured into a single-stage amplifier or a multi-stage amplifier that processes a received RF signal—e.g., configured as an LNA of a receive chain 202 to process a received RF signal. A given RF signal 210 (e.g., of FIGS. 2, 3-1, and 3-2) can be provided to an input of each of the multiple port interfaces 130-1 . . . 130-$p$. An activated port interface 130 forwards the RF signal 210 onward to the switch matrix 132. In FIG. 4, a first signal 410-1 corresponds to the RF signal 210 at a first time, and a second signal 410-2 corresponds to the RF signal 210 at a second time. In other scenarios, the first signal 410-1 and the second signal 410-2 can represent different frequency ranges of the RF signal 210 at different times or at a same time.

If a received RF signal—e.g., the second signal 410-2—has a relatively lower frequency that is in the second frequency band 404-2 and that is not appreciably attenuated by propagating over the switch matrix 132, the second port interface 130-2 is activated to forward the RF signal from the second port interface 130-2. Assuming the second signal 410-2 is to be processed by the first downlink pipe 134-1, the second port interface 130-2 forwards the second signal 410-2 over the second signal path 402-2 as part of a second signal propagation path 408-2 (the wavy arrow with thick, long-dashed lines). The first portion 302-1 of the amplifier 136-1 of the first downlink pipe 134-1 amplifies the forwarded signal using a single stage (or at least without also using a stage on the other side of the switch matrix 132 at the second port interface 130-2). In this case, an amplifier 136 can be instantiated by the amplifier 136-1 alone. The first downlink pipe 134-1 can also filter the amplified signal, perform frequency translation on the amplified signal, and so forth. Alternatively, the second port interface 130-2 can forward the second signal 410-2 over the fourth signal path 402-4 for processing by the first portion 302-1 of the amplifier 136-3 of the second downlink pipe 134-2. In this case, an amplifier 136 can be instantiated by the amplifier 136-3 alone.

On the other hand, a received RF signal—e.g., the first signal 410-1—may have a relatively higher frequency that is in the first frequency band 404-1 and that is likely to be appreciably attenuated by propagating across the switch matrix 132. If so, the first port interface 130-1 is activated. The first port interface 130-1 uses the second portion 302-2 of the amplifier 136-2 to amplify the first signal 410-1 to produce a partially-amplified signal before forwarding the partially-amplified signal over the first signal path 402-1 as part of a first signal propagation path 408-1 (the wavy arrow with thick, short-dashed lines). This first-stage amplification proactively counteracts the attenuation to be caused by propagating the signal across the switch matrix 132.

Assuming the first signal 410-1 is to be processed by the first downlink pipe 134-1, the first port interface 130-1 forwards the partially-amplified signal over the first signal path 402-1 of the switch matrix 132 to the first downlink pipe 134-1. To realize a divided instance of an amplifier 136 in this configuration, the first portion 302-1 of the amplifier 136-1 of the first downlink pipe 134-1 can further amplify the forwarded, partially-amplified signal using a second stage (or at least a subsequent stage after amplification by at least one stage of the amplifier 136-2 on the other side of the switch matrix 132 at the first port interface 130-1). In this case, an amplifier 136 can be instantiated by a combination of the amplifier 136-1 and the amplifier 136-2. The first downlink pipe 134-1 then further processes the amplified signal, such as by frequency down-converting the amplified signal or filtering the amplified signal. Alternatively, due to the multiple signal paths 402-1 to 402-4 included as part of the switch matrix 132, the first port interface 130-1 can forward—after partial amplification by the second portion 302-2 of the amplifier 136-2 at the first port interface 130-1—the partially-amplified signal over the third signal path 402-3 for further amplification by the first portion 302-1 of the amplifier 136-3 of the second downlink pipe 134-2. In this case, an amplifier 136 can be instantiated by a combination of the amplifier 136-3 and the amplifier 136-2.

Although only two port interfaces, two downlink pipes, and four signal paths are explicitly depicted in FIG. 4, more or fewer than two, two, or four of each, respectively, may alternatively be implemented. Example aspects of an inter-relationship and an interaction between a port interface 130 and a downlink pipe 134 are described further below from a schematic perspective with reference to FIG. 6 and from a circuit perspective with reference to FIG. 7. However, example components of a port interface 130 and a downlink pipe 134 are described first with reference to FIG. 5. For clarity, in FIG. 5 and subsequent figures, at least one particular instance of an amplifier 136 is illustrated and described herein without individual indications that are represented by numerical suffixes (e.g., without a "-X"). However, although one instance of an amplifier 136 in particular configurations may be illustrated in FIG. 5 et. seq. and described below, the principles are applicable to multiple combinations and permutations of amplifiers 136 across multiple port interfaces 130-1 ... 130-*p* or multiple downlink pipes 134-1 ... 134-*d* as described with reference to FIGS. 3-1, 3-2, and 4.

Figure 5:
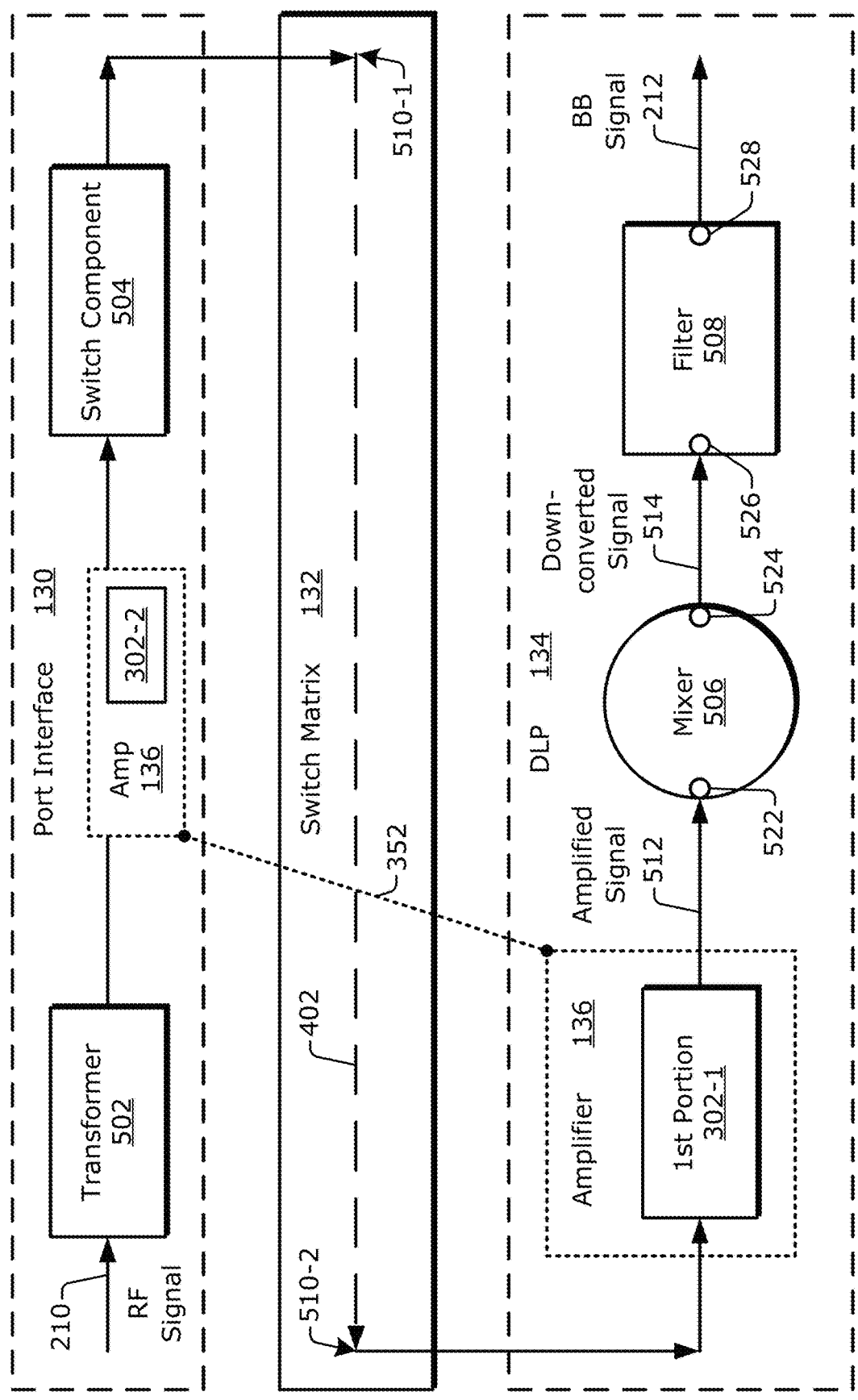
FIG. 5 illustrates a receive chain including an example port interface and an example DLP that are coupled together via a switch matrix.

FIG. 5 illustrates a receive chain 202 including an example port interface 130 and an example downlink pipe 134 that are coupled together via a switch matrix 132. As illustrated, the port interface 130 includes at least one transformer 502 and at least one switch component 504. The transformer 502 is an example implementation of the EM component 406 (of FIG. 4). Each switch component 504 can be in at least one state. For example, each switch component 504 can be in an engaged state or a disengaged state. If in an engaged state, the switch component 504 enables a signal to be forwarded from the port interface 130 to the switch matrix 132.

If the port interface 130 implements or contributes to a multi-stage configuration of the amplifier 136 (e.g., as depicted by the first port interface 130-1 in FIG. 4), the port interface 130 also includes a second portion 302-2 of the amplifier 136. In an example operation, responsive to the switch component 504 being engaged, the port interface 130 is activated to forward a signal to the downlink pipe 134 via the switch matrix 132. The transformer 502, the switch component 504, and the second portion 302-2 of the amplifier 136 are described below with reference to FIG. 6.

The port interface 130 is coupled to a signal path 402 of the switch matrix 132. The signal path 402 includes at least one end 510, such as a first end 510-1 and a second end 510-2. In FIG. 5, the first end 510-1 and the second end 510-2 respectively correspond to the input and the output of the switch matrix 132. A first portion 302-1 of the amplifier 136 is also coupled to the signal path 402 of the switch matrix 132. Thus, the first portion 302-1 and the second portion 302-2 of the amplifier 136 can be linked via the signal path 402 as represented by the amplifier linkage 352. In addition to the first portion 302-1 of the amplifier 136, the downlink pipe 134 also includes at least one mixer 506 and at least one filter 508.

In example implementations, the first portion 302-1 of the amplifier 136 is coupled to the mixer 506, and the mixer 506 is coupled to the filter 508. Specifically, the mixer 506 includes a mixer input node 522 and a mixer output node 524. The mixer input node 522 is coupled to the first portion 302-1 of the amplifier 136. The filter 508 includes a filter input node 526 and a filter output node 528. The filter input node 526 is coupled to the mixer output node 524.

In an example operation, the first portion 302-1 of the amplifier 136 produces an amplified signal 512 and provides the amplified signal 512 to the mixer 506 via the mixer input node 522. The mixer 506 down-converts the amplified signal 512 to produce a down-converted signal 514. The down-converted signal 514 can be implemented as an intermediate-frequency signal (IF signal) or as a baseband signal (BB signal). Regardless, the down-conversion can be performed in one, two, or more steps—e.g., using a direct conversion or a superheterodyne architecture. Thus, the at least one filter 508 can be implemented as an IF filter or a BB filter, as a low-pass filter, and so forth. The mixer 506 provides the down-converted signal 514 to the filter 508 via the mixer output node 524 and the filter input node 526. After the signal is down-converted to a baseband frequency through one or more frequency translation steps, the filter 508 can provide the baseband signal 212 to a downstream component (e.g., the communication processor 124 of FIGS. 1 and 2) via the filter output node 528. Although only certain components are explicitly illustrated as part of the downlink pipe 134 and described herein, the downlink pipe 134 can include other components, such as a buffer, another amplifier, an ADC, a quadrature signal generator, duplicate components for repeated filtering or amplification, and so forth.

The signaling is represented in many of the drawings, such as FIG. 5, using a single arrow. However, the signals can be realized in different manners, so the single arrow does not necessarily represent one line or wire or one signal component. For example, a signal can be implemented with differential signaling, which can include a plus signal and a minus signal or a 0-degree signal and a 180-degree signal. As another example, the signaling can be multi-phasic or use quadrature signaling. A signal can be processed using an in-phase component (I signal) and a quadrature component (Q signal), which can be implemented with signals having 0° and 90° phases relative to one another. The mixer 506, for instance, can be realized with two mixers: an I-component mixer and a Q-component mixer. Further, the signal processing can be implemented using both differential signaling and quadrature signaling such that the down-converted signal 514, for instance, propagates over four lines.

Figure 6:
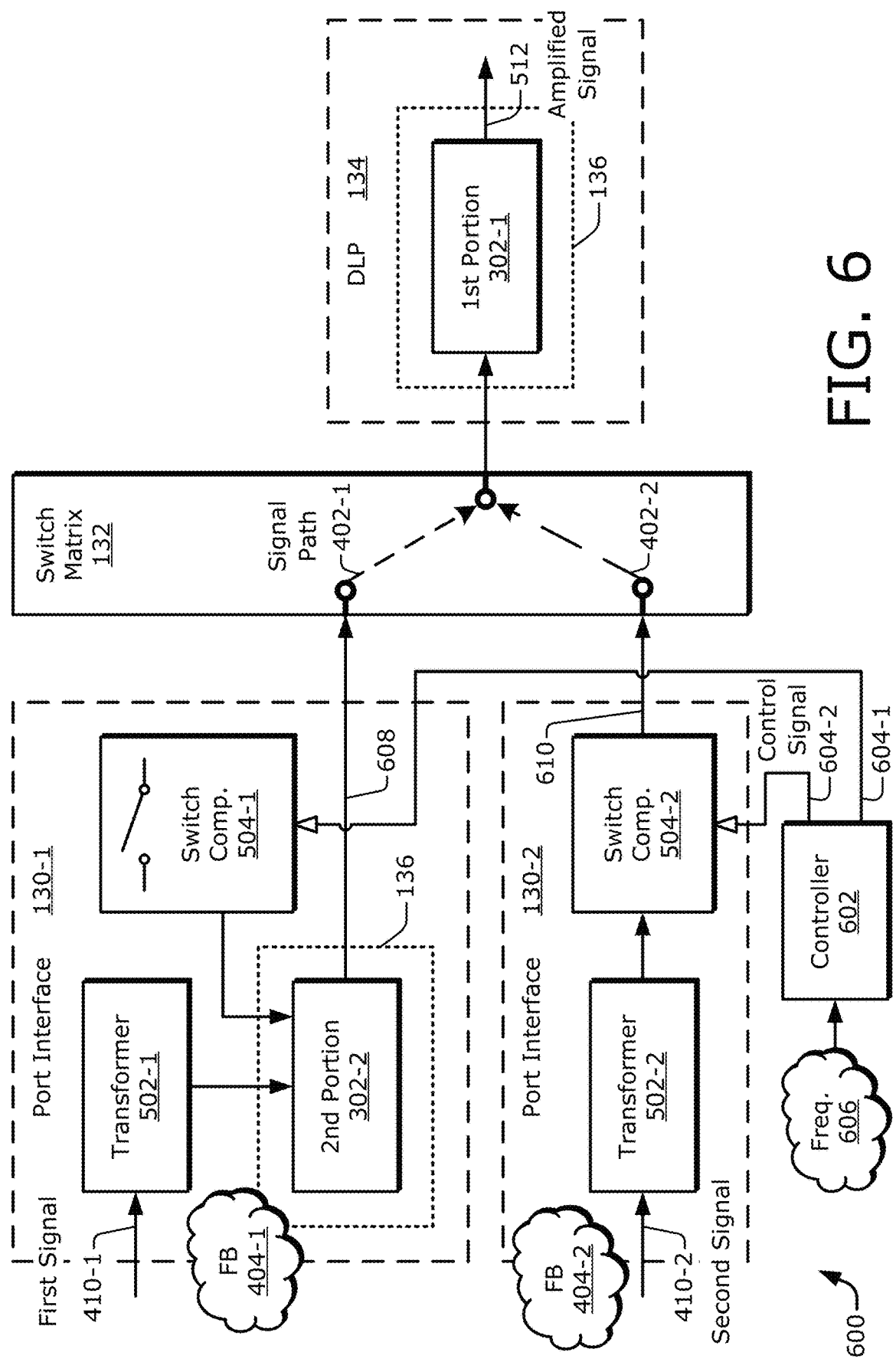
FIG. 6 illustrates a schematic diagram of a receive chain with an example amplifier having a first portion as part of a DLP and a second portion as part of a port interface.

FIG. 6 illustrates an example schematic diagram 600 of a receive chain with an example amplifier 136 having a first portion 302-1 as part of a downlink pipe 134 and a second portion 302-2 as part of a first port interface 130-1. In this example, the second port interface 130-2 omits or lacks a second portion 302-2 of the amplifier 136. As illustrated, each port interface 130 includes at least one transformer 502 and at least one switch component 504. The first port interface 130-1 includes a first transformer 502-1, a first switch component 504-1, and the second portion 302-2 of the amplifier 136. The second port interface 130-2 includes a second transformer 502-2 and a second switch component 504-2. The schematic diagram 600 also includes a controller 602 and a switch matrix 132.

In example implementations, the first transformer 502-1 comprises a port that couples the first port interface 130-1 to the antenna 122 (e.g., of FIG. 2) via the antenna feed line 204 of the RF front-end 128. The second portion 302-2 of the amplifier 136 and the first switch component 504-1 are coupled to the first transformer 502-1. The first switch component 504-1 is coupled to at least one of the first transformer 502-1 or the second portion 302-2 of the amplifier 136. The first switch component 504-1 provides an example first activation mechanism for activating the first port interface 130-1. Also, the second portion 302-2 of the amplifier 136 is coupled to the first portion 302-1 of the amplifier 136 via the first signal path 402-1 of the switch matrix 132. With respect to the second port interface 130-2, the second transformer 502-2 comprises a port that couples the second port interface 130-2 to the antenna 122 via the antenna feed line 204 of the RF front-end 128. The second switch component 504-2 is coupled to the second transformer 502-2. The second switch component 504-2 provides an example second activation mechanism for activating the second port interface 130-2. The second switch component 504-2 is also coupled to the first portion 302-1 of the amplifier 136 via the second signal path 402-2 of the switch matrix 132.

In example operations, a switch component 504 is engaged to activate an associated port interface 130. Example techniques for engaging a switch component 504 (e.g., closing a switch or selecting a bias voltage value of a bias voltage node to establish an engaged state) are described below with reference to the circuit diagram of FIG. 7. The controller 602 engages a switch component 504 to activate a given port interface 130 based on frequency. The controller 602 may be realized as part of the communication processor 124, as part of the transceiver 126, as other digital circuitry, as part of another processor, some combination thereof, and so forth. The controller 602 activates a given port interface 130 responsive to an RF signal 210 having a frequency 606 that is within a frequency band 404 corresponding to the given port interface 130 or the transformer 502 thereof. In these manners, the controller 602 provides an example control mechanism for selectively engaging the first switch component 504-1 or the second switch component 504-2 based on: a frequency 606 of a signal 410 to be processed, a first frequency band 404-1 corresponding to the first port interface 130-1, and a second frequency band 404-2 corresponding to the second port interface 130-2. To engage a switch component 504, the controller 602 provides a control signal 604. Specifically, the controller 602 provides a first control signal 604-1 to the first switch component 504-1 or a second control signal 604-2 to the second switch component 504-2.

Like in FIG. 4, the RF signal 210 is represented by a first signal 410-1 and a second signal 410-2. If the frequency 606 of the RF signal 210 (e.g., of the first signal 410-1) is within the first frequency band 404-1, the controller 602 uses the first control signal 604-1 to engage the first switch component 504-1 to activate the first port interface 130-1. Responsive to activation of the first port interface 130-1, the second portion 302-2 and the first portion 302-1 of the amplifier 136 jointly operate as a multi-stage amplifier across the switch matrix 132. Thus, the first transformer 502-1 couples the first signal 410-1 into the first port interface 130-1. The second portion 302-2 of the amplifier 136 amplifies the first signal 410-1 to produce a partially-amplified signal 608. Thus, the second portion 302-2 of the amplifier 136 provides an example second amplification mechanism for amplifying a signal. The second portion 302-2 forwards the partially-amplified signal 608 over the first signal path 402-1 to the first portion 302-1. Accordingly, the partially-amplified signal 608 propagates across the switch matrix 132 between the second portion 302-2 and the first portion 302-1 of the amplifier 136. The first portion 302-1 amplifies the partially-amplified signal 608 to produce the amplified signal 512. Thus, the first portion 302-1 of the amplifier 136 provides an example first amplification mechanism for amplifying a signal.

On the other hand, if the frequency 606 of the RF signal 210 (e.g., of the second signal 410-2) is within the second frequency band 404-2, the controller 602 uses the second control signal 604-2 to engage the second switch component 504-2 to activate the second port interface 130-2. Responsive to activation of the second port interface 130-2, the first portion 302-1 of the amplifier 136 operates as a single-stage amplifier that is not divided by the switch matrix 132. Thus, the second transformer 502-2 couples the second signal 410-2 into the second port interface 130-2 and provides the signal to the second switch component 504-2. The second switch component 504-2 passes the signal onward without amplification yet by the amplifier 136. The second switch component 504-2 therefore forwards a passed signal 610 over the second signal path 402-2 of the switch matrix 132 to the first portion 302-1 of the amplifier 136. The first portion 302-1 amplifies the passed signal 610 to produce the amplified signal 512. Thus, the first portion 302-1 of the amplifier 136 provides an example first amplification mechanism for amplifying a signal.

Although each port interface 130 is shown as including one switch component 504, each port interface 130 may include multiple switch components. Each switch component 504 of such multiple switch components is coupled to a respective downlink pipe 134 via a respective signal path 402 of the switch matrix 132. Similarly, each port interface 130 that includes a second portion 302-2 may include multiple second portions of the amplifier 136 to provide an antenna-side amplification stage for each first portion 302-1 of the amplifier 136 of a respective downlink pipe 134. Also, although only first and second port interfaces 130-1 and 130-2 are explicitly depicted, the schematic diagram 600 can include more port interfaces. For example, a third port interface can include a third transformer, a third switch component, and another second portion 302-2 of the amplifier 136. This is depicted more clearly in other FIGS., such as the FIGS. 3-2, 4, 8, and 9.

Figure 7:
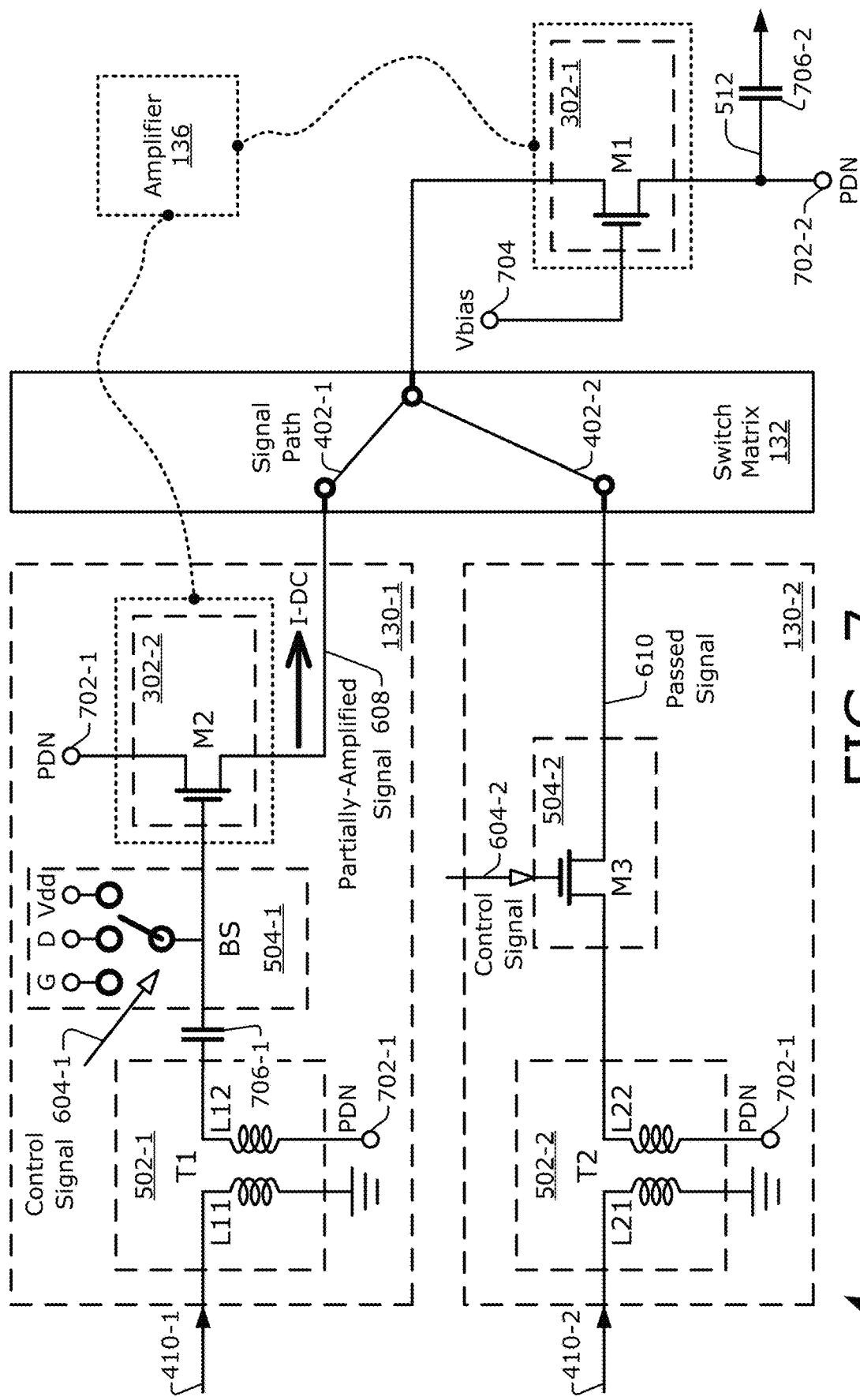
FIG. 7 illustrates a circuit diagram of a receive chain with an example amplifier having a first portion as part of a DLP and a second portion as part of a port interface.

FIG. 7 illustrates an example circuit diagram 700 of a receive chain with an example amplifier 136 having a first portion 302-1 as part of a downlink pipe 134 (e.g., of FIG. 6) and a second portion 302-2 as part of a first port interface 130-1. Example circuit components are depicted for each of the schematic components of FIG. 6. Thus, in some implementations, the first portion 302-1 of the amplifier 136 is realized as a transistor M1, and the second portion 302-2 of the amplifier 136 is realized as a transistor M2. The first switch component 504-1 is implemented with a single-pole, triple-throw bias switch BS to enable the first switch component 504-1 to couple at least one bias voltage node to a gate terminal of the transistor M2.

The bias switch BS can couple to, for example, a ground node for a ground voltage (G), a voltage supply rail for a supply voltage (Vdd), or an intermediate or bias voltage node for a diode-biasing voltage (D). However, the bias switch BS can include more or fewer than either one pole or three throws. Each bias switch BS can be implemented using one or more transistors—e.g., one transistor per throw. Thus, each such transistor can operate as a first switch transistor for the first switch component 504-1 of the first port interface 130-1. The second switch component 504-2 is implemented with a transistor M3. The first transformer 502-1 is implemented with a transformer T1 including at least a first inductor L11 and a second inductor L12. The second transformer 502-2 is implemented with a transformer T2 including at least a first inductor L21 and a second inductor L22.

The circuitry of the circuit diagram 700 obtains power from multiple power distribution nodes 702 (PDN 702). Specifically, different circuit components are coupled between a first power distribution node 702-1 and a second power distribution node 702-2. In some implementations, the first power distribution node 702-1 corresponds to a supply voltage node, and the second power distribution node 702-2 corresponds to a ground node. In other implementations, the first power distribution node 702-1 corresponds to a ground node, and the second power distribution node 702-2 corresponds to a supply voltage node (e.g., a voltage supply rail with a supply voltage Vdd). In the depicted example, each transformer 502 is coupled to ground or the first power distribution node 702-1 via the first and second inductors respectively. In this configuration, the transformers convert from single-ended signaling on an antenna side to double-ended or differential signaling on a communication processor side of the transformer. However, the first transformer 502-1 or the second transformer 502-2 may be configured in alternative manners.

The illustrated portion of a receive chain also includes multiple alternating-current (AC) coupling capacitors 706. One AC coupling capacitor 706-1 is coupled between the first transformer 502-1 and the first switch component 504-1. This enables the bias switch BS to set a direct-current (DC) bias voltage for the transistor M2. Another AC coupling capacitor 706-2 is electrically-positioned after the transformer M1 and is coupled between an output of the first portion 302-1 of the amplifier 136 and an input of a downstream component of the receive chain (e.g., a mixer 506 of FIG. 5).

The transistors (e.g., transistors M1, M2, and M3) may be implemented using any suitable technology, such as a field effect transistor (FET) or a bipolar junction transistor (BJT). If implemented as an FET, any suitable FET technology may be utilized. For example, each transistor may be fabricated as metal-oxide-semiconductor (MOS) FET (MOSFET). Further, the FETs may be implemented as an n-type MOSFET (nMOSFET) or a p-type MOSFET (pMOSFET). In FIG. 7, each transistor is depicted universally as an FET that can be implemented as n-type or p-type. Each FET includes at least three terminals: two channel terminals (e.g., a first channel terminal and a second channel terminal) and a gate terminal. The two channel terminals can include a source terminal and a drain terminal.

Example operational implementations are described next. In operation for the first portion 302-1 of the amplifier 136, the transistor M1 can be configured as a common-gate amplifier. The transistor M1 is biased with bias voltage 704 (Vbias 704) into an analog operational mode (e.g., into an analog range enabling amplification of a signal that is input at a terminal of the transistor). Signals that are forwarded from a port interface 130 across the switch matrix 132 are provided as an input signal to the first portion 302-1. The transistor M1 amplifies the forwarded signal and produces an amplified signal 512. Thus, the transistor M1 can operate as a first amplifier transistor for the first portion 302-1 of the amplifier 136. The forwarded signal can arrive at the first portion 302-1 from a port interface 130 that includes a second portion 302-2 of the amplifier 136 (e.g., the first port interface 130-1) or from a port interface 130 that omits a second portion 302-2 of the amplifier 136 (e.g., the second port interface 130-2).

Figure 8:
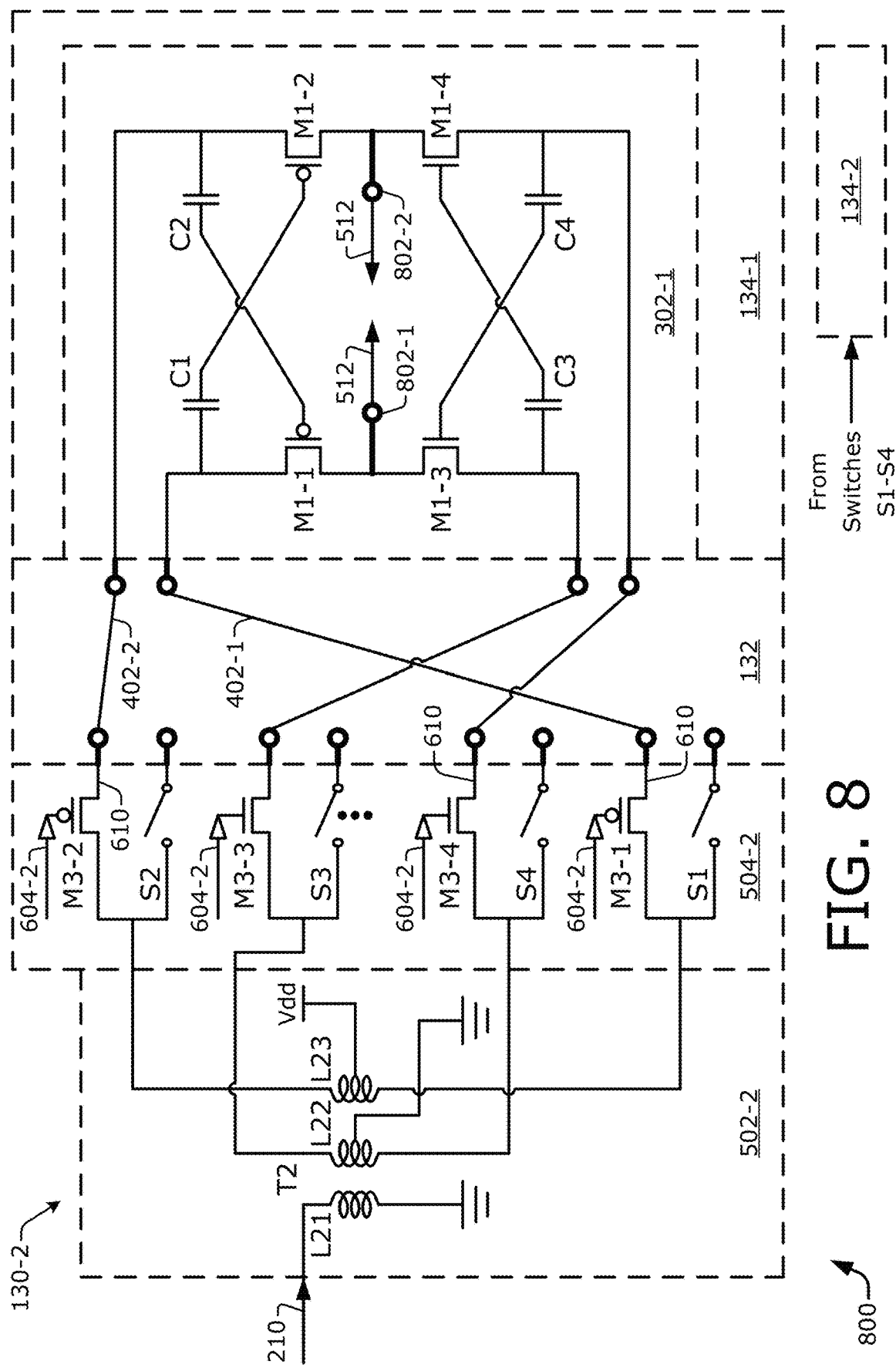
FIG. 8 is a circuit diagram illustrating an example first portion of an amplifier as part of a DLP and an example port interface that does not include a second portion of the amplifier.

The second port interface 130-2 is activated responsive to engagement of the second switch component 504-2 based on the second control signal 604-2, which is coupled to a gate terminal of the transistor M3. Here, the second control signal 604-2 can engage the transistor M3 by turning the transistor on and therefore "closing" the second switch component 504-2. Responsive to being turned on, the transistor M3 propagates a signal accepted from the second transformer T2 at a channel terminal of the transistor M3 to another channel terminal thereof and then passes the signal to the switch matrix 132 without amplification by the amplifier 136. Thus, the transistor M3 can operate as second switch transistor for the second switch component 504-2 of the second port interface 130-2. The second switch component 504-2 therefore forwards the passed signal 610 over the second signal path 402-2 of the switch matrix 132 to the input of the first portion 302-1 of the amplifier 136. The transistor M1 amplifies the passed signal 610 to produce the amplified signal 512. Other implementations of a second port interface 130-2 are depicted in FIG. 8.

The first port interface 130-1 is activated responsive to engagement of the first switch component 504-1 based on the first control signal 604-1. Here, the first control signal 604-1 can engage the bias switch BS by selecting a bias voltage that biases the transistor M2 of the second portion 302-2 into an operational range that produces a transconductance (Gm) device. For example, the bias switch BS can select the bias voltage node that provides a diode voltage (D) across a gate terminal and a source terminal of the transistor M2. Also, if the transistor M2 comprises an n-type transistor, the bias switch BS can couple the supply voltage (Vdd) to a gate terminal of the transistor M2 to turn it on. If, on the other hand, the transistor M2 comprises a p-type transistor, the bias switch BS can couple the ground voltage (G) to the gate terminal of the transistor M2 to turn it on. Responsive to being biased into a Gm-device range, the transistor M2 acts an amplification stage for the second portion 302-2 of the amplifier 136. The transistor M2 therefore amplifies a signal accepted from the first transformer T1 to produce a partially-amplified signal 608. Thus, the transistor M2 can operate as a second amplifier transistor for the second portion 302-2 of the amplifier 136. The partially-amplified signal 608 can represent a signal that has been amplified by at least one stage of the amplifier 136 but not a final stage thereof.

Based on the bias voltage provided by the bias switch BS, the transistor M2 can operate from an AC perspective as a common-source amplifier in which a source terminal thereof is coupled to the first power distribution node 702-1. If differential signaling is employed, the second portion 302-2 can be realized as a common-source differential amplifier. The drain terminal of the transistor M2, which outputs the partially-amplified signal 608, is therefore coupled to the first signal path 402-1. The second portion 302-2 forwards the partially-amplified signal 608 over the first signal path 402-1 of the switch matrix 132 to the input of the first portion 302-1 of the amplifier 136. The transistor M1 amplifies the partially-amplified signal 608 to produce the amplified signal 512.

Figure 9:
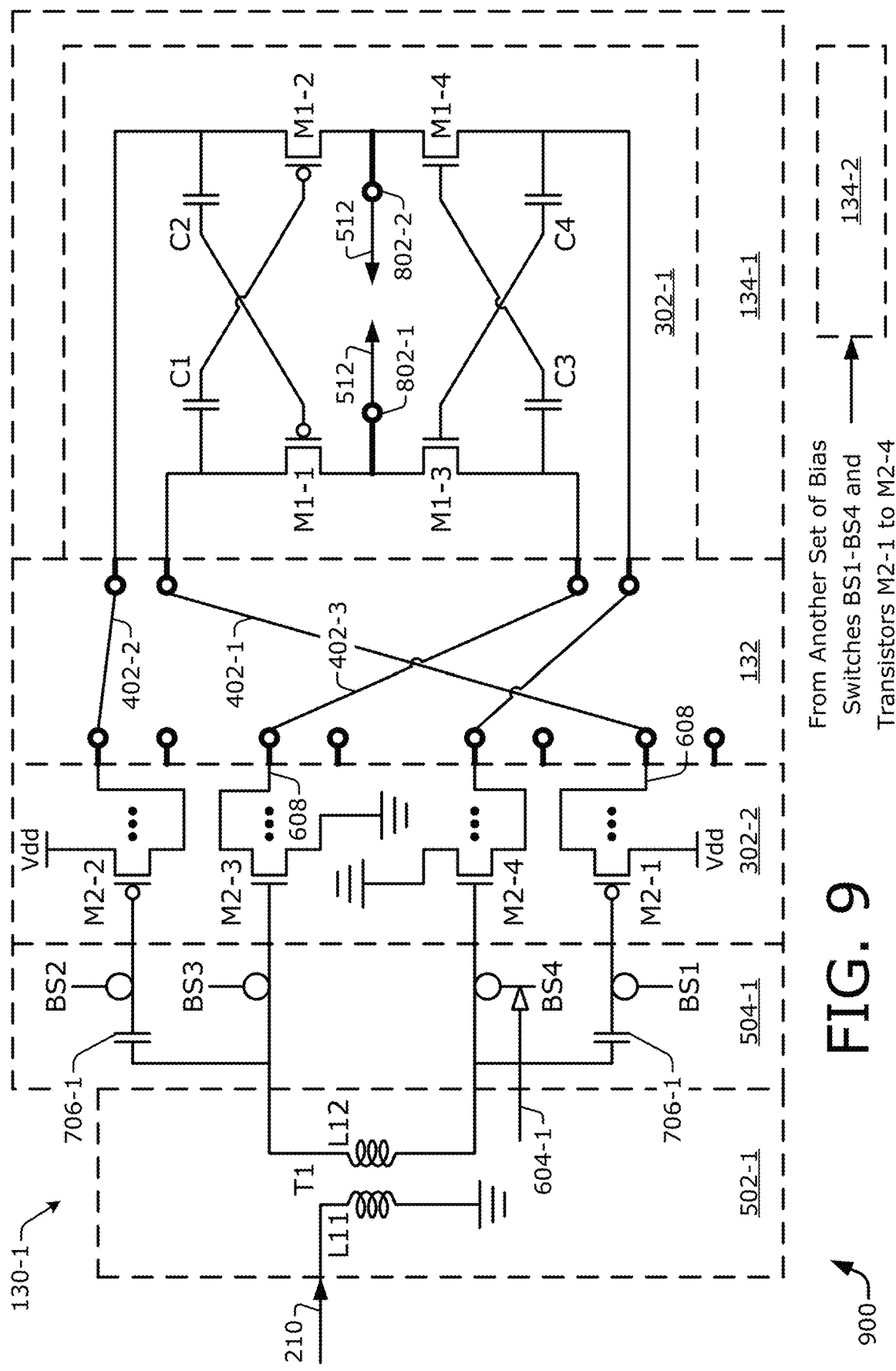
FIG. 9 is a circuit diagram illustrating an example first portion of an amplifier as part of a DLP and an example port interface that includes a second portion of the amplifier.

A divided amplifier, such as a multi-portion 302 amplifier 136, can include two or more stages. In the illustrated example, the amplifier 136 includes two portions configured as two stages. Moreover, a first stage provided by the second portion 302-2 can operate as a main stage, and a second stage provided by the first portion 302-1 can operate as a cascode stage to realize a cascode amplifier. In such cases, as illustrated in FIG. 7, the second portion 302-2 operates as a common-source amplifier for the main stage, and the first portion 302-1 operates as a common-gate amplifier for the cascode stage. Other implementations of a first port interface 130-1 with a divided amplifier are depicted in FIG. 9.

With reference also to FIG. 4, different signal propagation paths 408 can be established using the components illustrated in FIG. 7 responsive to activation of a given port interface 130 by a respective switch component 504. For example, the first switch component 504-1 provides an example first activation mechanism that includes a mechanism for establishing a first signal propagation path 408-1 for the first signal 410-1 between the first transformer 502-1 and the first portion 302-1 of the amplifier 136. Here, the mechanism for establishing the first signal propagation path 408-1 can also include or interact with the second portion 302-2 of the amplifier 136, a first signal path 402-1 of the switch matrix 132, and the first portion 302-1 of the amplifier 136. Similarly, the second switch component 504-2 provides an example second activation mechanism that includes a mechanism for establishing a second signal propagation path 408-2 for the second signal 410-2 between the second transformer 502-2 and the first portion 302-1 of the amplifier 136. Here, the mechanism for establishing the second signal propagation path 408-2 can also include or interact with a channel of the transistor M3 of the second switch component 504-2, a second signal path 402-2 of the switch matrix 132, and the first portion 302-1 of the amplifier 136.

As shown, the transistor M2 of the second portion 302-2 of the amplifier 136 is coupled in series with the transistor M1 of the first portion 302-1 of the amplifier 136 between a first power distribution node 702-1 and a second power distribution node 702-2. Thus, a direct-current current (DC current) (I-DC) flows through both the transistor M2 of the second portion 302-2 and the transistor M1 of the first portion 302-1. By using a same current for multiple stages of the amplifier 136, power is conserved. If the first power distribution node 702-1 comprises a supply voltage node, and the second power distribution node 702-2 comprises a ground, the DC current (I-DC) flows in the direction indicated in FIG. 7. In this case, the transistors M2 and M1 can be realized with p-type transistors. On the other hand, if the first power distribution node 702-1 comprises a ground, and the second power distribution node 702-2 comprises a supply voltage node, the DC current (I-DC) flows in an opposite direction than that which is indicated in FIG. 7 (e.g., the DC current flows from the transistor M1 to the transistor M2). In this case, the transistors M2 and M1 can be realized with n-type transistors. Moreover, some implementations can use both n-type and p-type transistors to realize circuitry with complementary (MOS) (CMOS) technology. Example implementations that employ both differential signaling and CMOS technology are described with reference to FIGS. 8 and 9.

FIG. 8 is a circuit diagram 800 illustrating an example first portion 302-1 of an amplifier 136 (e.g., of FIGS. 6 and 7) that is part of a first downlink pipe 134-1 and an example second port interface 130-2 that does not include a second portion of the amplifier 136. As explicitly illustrated, the second port interface 130-2 can be coupled to two different downlink pipes, such as the first downlink pipe 134-1 and a second downlink pipe 134-2, via the switch matrix 132. However, as indicated by the ellipses under switch S3, the illustrated second port interface 130-2 can be expanded to be capable of being operatively connected to more than two different downlink pipes (e.g., connected such that a signal from the second port interface 130-2 can be provided to the downlink pipe 134 for further processing). The illustrated second port interface 130-2 can be implemented without the AC coupling capacitor 706-1 (of FIGS. 7 and 9) and with fewer transistors as compared to the first port interface 130-1 (e.g., of FIGS. 6, 7, and 9). However, the second port interface 130-2 includes an additional inductor (three inductors) and does not provide an amplification stage for the amplifier 136 for propagating higher-frequency signals across the switch matrix 132.

In some implementations, each port interface 130, each downlink pipe 134, and the switch matrix 132, which is coupled therebetween, operate using differential signaling and with CMOS technology. In FIG. 8, the first portion 302-1 of the amplifier 136 comprises a cross-coupled differential amplifier with complementary transistors. The first portion 302-1 can therefore be realized as a complementary metal-oxide-semiconductor (CMOS) cross-coupled differential amplifier. Such amplifiers can exhibit left-right symmetry. As shown, the transistor M1 of FIG. 7 is implemented using four transistors: two PMOS transistors M1-1 and M1-2 and two NMOS transistors M1-3 and M1-4. Each of the transistors M1-1, M1-2, M1-3, and M1-4 can operate as a first amplifier transistor for the first portion 302-1 of the amplifier 136. The first portion 302-1 also includes four capacitors C1, C2, C3, and C4. The capacitors provide AC cross-coupling between transistors via respective gate terminals and source terminals. For example, the capacitor C1 is coupled between a source terminal of the transistor M1-1 and a gate terminal of the transistor M1-2. With this implementation, the first portion 302-1 operates as a hybrid between common-gate and common-source amplifier configurations.

The second port interface 130-2 includes a second transformer 502-2 and a second switch component 504-2. The second transformer 502-2 is implemented as a triple-coupled transformer with three inductors L21, L22, and L23. The incoming RF signal 210 is coupled to both the inductor L22 and the inductor L23 by the inductor L21. The inductor L22 includes a center tap that is coupled to ground for the NMOS transistors M1-3 and M1-4 of the first portion 302-1. The inductor L23 includes a center tap that is coupled to a supply voltage for the PMOS transistors M1-1 and M1-2 of the first portion 302-1.

The second switch component 504-2 includes a set of four switches for each respective downlink pipe 134 to which the second port interface 130-2 may be connected via the switch matrix 132. The circuit diagram 800 therefore has two sets of four switches explicitly depicted. Although not shown, the switches S1, S2, S3, and S4 are coupled to the second downlink pipe 134-2 via the switch matrix 132. In contrast, the signal paths 402 are depicted for the four switches that are depicted as being implemented with transistors. Specifically, the transistor M3 (of FIG. 7) is implemented with four transistors: M3-1 M3-2, M3-3, and M3-4. The switch M3-1 is coupled to and acts as a signal pass-through for the transistor M1-1, and the switch M3-2 is coupled to and acts as a signal pass-through for the transistor M1-2. The switch M3-3 is coupled to and acts as a signal pass-through for the transistor M1-3, and the switch M3-4 is coupled to and acts as a signal pass-through for the transistor M1-4. As described further below, each of the transistors M3-1, M3-2, M3-3, and M3-4 can operate as second switch transistor for the second switch component 504-2 of the second port interface 130-2.

The NMOS transistor M3-3 is coupled between one end of the inductor L22 and a source terminal of the NMOS transistor M1-3. The NMOS transistor M3-4 is coupled between the other end of the inductor L22 and a source terminal of the NMOS transistor M1-4. The PMOS transistor M3-2 is coupled between one end of the inductor L23 and a source terminal of the PMOS transistor M1-2. The PMOS transistor M3-1 is coupled between the other end of the inductor L23 and a source terminal of the PMOS transistor M1-1. A drain terminal of the PMOS transistor M1-1 is coupled to a drain terminal of the NMOS transistor M1-3 to provide a first amplifier output node 802-1 (e.g., a plus output node) for the amplified signal 512. A drain terminal of the PMOS transistor M1-2 is coupled to a drain terminal of the NMOS transistor M1-4 to provide a second amplifier output node 802-2 (e.g., a minus output node) for the amplified signal 512.

In example operations, a controller 602 (of FIG. 6) generates a second control signal 604-2. The control signal 604-2 is routed to a gate terminal of each of the four transistors M3-1 to M3-4 to turn them on, which effectively closes a switch to permit a signal from the transformer T2 to pass to the switch matrix 132. For the NMOS transistors M3-3 and M3-4, the second control signal 604-2 can provide a high voltage (e.g., a supply voltage Vdd). For the PMOS transistors M3-1 and M3-2, the second control signal 604-2 can provide a low voltage (e.g., a ground voltage G). Each of the transistors M3-1 to M3-4 therefore forwards a version or component of the signal across the switch matrix 132 to the first portion 302-1. For example, a component of a signal can flow from one side of the inductor L23 through the PMOS transistor M3-2, over a second signal path 402-2 of the switch matrix 132 as a passed signal 610, and to the amplifier output nodes 802 via the capacitor C2 and the PMOS transistors M1-1 and M1-2. Another component of the signal can flow from the other side of the inductor L23 through the PMOS transistor M3-1, over a first signal path 402-1 of the switch matrix 132, and to the amplifier output nodes 802 via the capacitor C1 and the PMOS transistors M1-1 and M1-2. Signal components propagating from the inductor L22 and through the NMOS transistors M3-3 and M3-4 to the NMOS transistors M1-3 and M1-4 function in a complementary manner.

FIG. 9 is a circuit diagram 900 illustrating an example first portion 302-1 of an amplifier 136 (e.g., of FIGS. 5, 6, and 7) that are part of a first downlink pipe 134-1 and an example first port interface 130-1 that includes a second portion 302-2 of the amplifier 136. The implementation of the first portion 302-1 in FIG. 9 is comparable to the first portion 302-1 in FIG. 8. With regard to the first port interface 130-1, the bias switch BS and the transistor M2 (both of FIG. 7) are each implemented with four components to handle differential signaling and to realize a CMOS architecture. The illustrated first port interface 130-1 can be implemented without a third inductor in the transformer T1 (like the transformer T2 has in FIG. 8 for the second port interface 130-2), and the first port interface 130-1 provides an amplification stage for the amplifier 136 for propagating, e.g., higher-frequency signals across the switch matrix 132. However, the first port interface 130-1 includes multiple AC coupling capacitors 706-1 and uses more transistors as compared to the second port interface 130-2 (e.g., of FIGS. 6, 7, and 8) due to the multiple transistors used in the bias switches BS1 to BS4 or the additional amplifier transistors M2.

The bias switch BS of FIG. 7 is implemented using four bias switches BS1, BS2, BS3, and BS4 in FIG. 9. Although not explicitly shown in FIG. 9, each of the bias switches BS1, BS2, BS3, and BS4 can include at least one respective first switch transistor for the first switch component 504-1 of the first port interface 130-1. The transistor M2 of FIG. 7 is implemented using four transistors M2-1, M2-2, M2-3, and M2-4 in FIG. 9. Each of the transistors M2-1, M2-2, M2-3, and M2-4 can operate as a second amplifier transistor for the second portion 302-2 of the amplifier 136. Each bias switch BS1 to BS4 accepts the first control signal 604-1. However, for clarity, only one first control signal 604-1 is depicted, which is coupled to the fourth bias switch BS4. For the first port interface 130-1, one set of four bias switches BS1 to BS4 and four transistors M2-1 to M2-4 are explicitly depicted. However, as indicated by the ellipses near the four transistors M2-1 to M2-4, the first switch component 504-1 can include multiple sets of four bias switches, and the second portion 302-2 can include multiple sets of four transistors. In other words, the first port interface 130-1 can include one set of four bias switches and one set of four transistors for each downlink pipe 134 to which the first port interface 130-1 may be connected (e.g., as represented by the second downlink pipe 134-2).

In example operations, a controller 602 (of FIG. 6) generates a first control signal 604-1. A control signal 604-1 is routed to each of the four bias switches BS-1 to BS-4 to engage them. The engagement causes a respective bias switch BS to bias a respective transistor M2 into an analog amplification range. This enables the respective transistor M2 to amplify a signal accepted from the transformer T1 and forward a partially-amplified signal 608 to the switch matrix 132. The four transistors M2-1 to M2-4 of the second portion 302-2 can be jointly implemented as a CMOS common-source differential amplifier as shown. For example, the transistor M2-3 is realized as an NMOS transistor that is coupled to the ground via a source terminal thereof and is coupled to the inductor L12 via a gate terminal of the transistor M2-3. A component of a signal can flow from one side of the inductor L12 to the gate terminal of the transistor M2-3. The transistor M2-3, using a common-source amplifier configuration, amplifies the signal from the inductor L12 to produce a partially-amplified signal 608. The transistor M2-3 forwards the partially-amplified signal 608 to the switch matrix 132.

The switch matrix 132 propagates the partially-amplified signal 608 over a third signal path 402-3 from the second portion 302-2 of the amplifier 136 to the first portion 302-1 of the amplifier 136. The partially-amplified signal 608 is provided to the NMOS transistor M1-3 via a source terminal thereof and to the NMOS transistor M1-4 via the capacitor C3 and a gate terminal of the transistor M1-4. The NMOS transistors M1-3 and M1-4 of the first portion 302-1 further amplify the partially-amplified signal 608 to produce at least a portion of the amplified signal 512, which is provided at the first and second amplifier output nodes 802-1 and 802-2. The other three transistors M2-1, M2-2, and M2-4, along with the respective associated bias switch BS, operate similarly. In these manners, the amplifier 136 is divided by the switch matrix 132 into at least the first portion 302-1 and the second portion 302-2.

Figure 10:
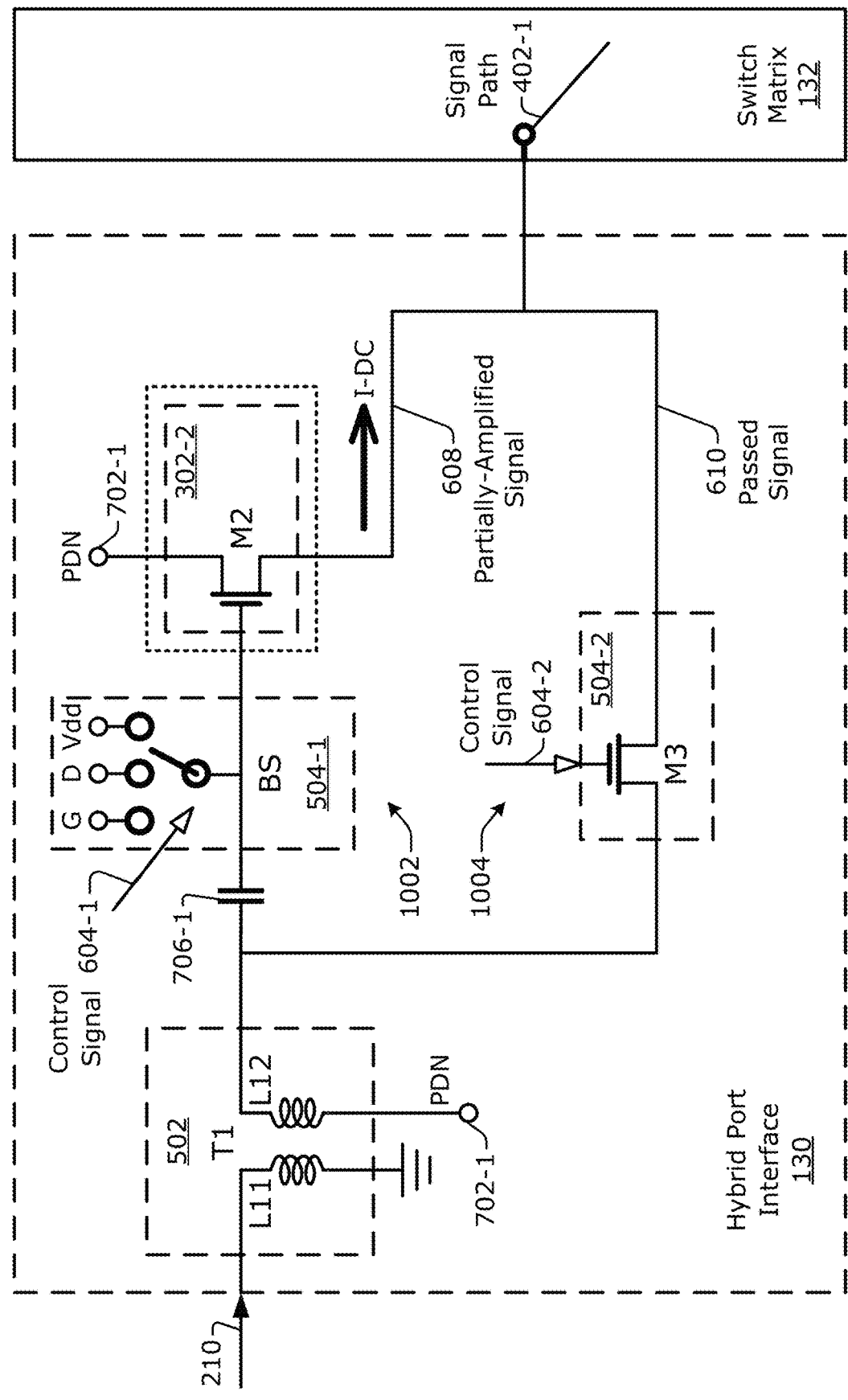
FIG. 10 is a circuit diagram illustrating an example hybrid port interface that can operate using a second portion of an amplifier and can operate without using a second portion.

FIG. 10 is a circuit diagram 1000 illustrating an example hybrid port interface 130 that can operate with or without a portion 302 of the amplifier 136 (e.g., of FIGS. 6 and 7). In some implementations, a signal from the transformer 502 can be selectively routed to one of at least two different paths. For a first path 1002, responsive to operation of the bias switch BS of the first switch component 504-1, the signal is amplified by the transistor M2 of the second portion 302-2 of the amplifier 136 to produce a partially-amplified signal 608, which is forwarded to the switch matrix 132. For a second path 1004, the signal from the transformer 502 is passed through the transistor M3 of the second switch component 504-2 without amplification by the amplifier 136 as a passed signal 610. In this case, the passed signal 610 is forwarded to the switch matrix 132. To support the second path 1004, the transformer 502 can be configured with three inductors like the second transformer 502-2 that is depicted in FIG. 8. Thus, signals having a frequency that is within a frequency band corresponding to the transformer 502 can be selectively partially-amplified by a given hybrid port interface 130. In these manners, the hybrid port interface 130 of FIG. 10 provides an example mechanism for bypassing the second portion 302-2 of the amplifier 136.

Figure 11:
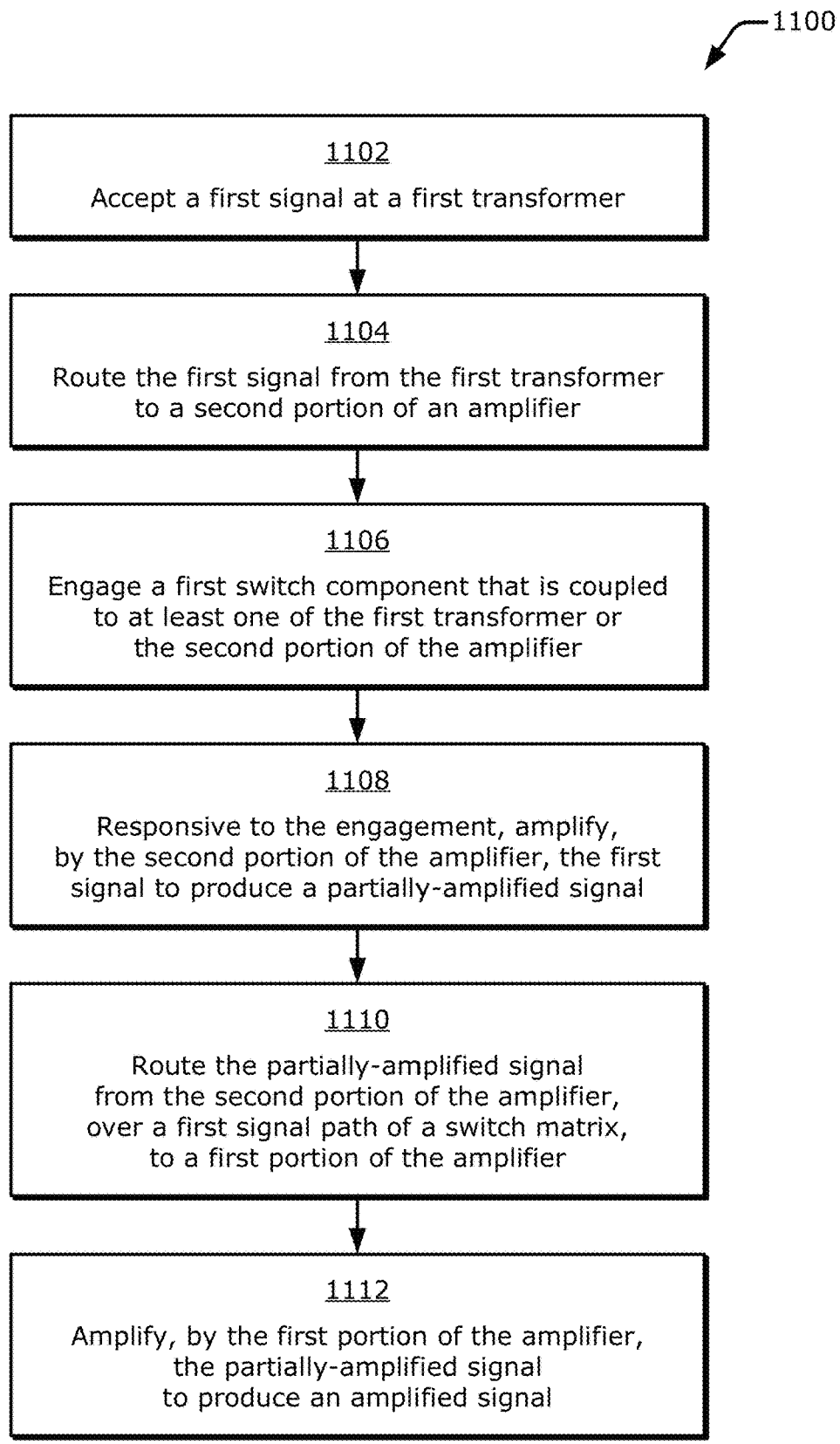
FIG. 11 is a flow diagram illustrating an example process for operating a divided amplifier to process a signal.

FIG. 11 is a flow diagram illustrating an example process 1100 for processing a signal. The process 1100 is described in the form of a set of blocks 1102-1112 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100, or an alternative process. Operations represented by the illustrated blocks of the process 1100 may be performed by an electronic device 102 or a portion thereof, such as by a receive chain 202. More specifically, the operations of the process 1100 may be performed by at least one port interface 130, a switch matrix 132, and at least one downlink pipe 134.

At block 1102, a first signal is accepted at a first transformer. For example, an electronic device 102 can accept a first signal 410-1 at a first transformer 502-1. For instance, a first transformer T1 may accept a first signal 410-1 from an upstream component, such as an antenna feed line 204 of an RF front-end 128 or an antenna 122.

At block 1104, the first signal is routed from the first transformer to a second portion of an amplifier. For example, the electronic device 102 can route the first signal 410-1 from the first transformer 502-1 to a second portion 302-2 of an amplifier 136. This routing may be performed by a first port interface 130-1 between the transformer T1 and a second amplifier transistor M2.

At block 1106, a first switch component, which is coupled to at least one of the first transformer or the second portion of the amplifier, is engaged. For example, the electronic device 102 can engage a first switch component 504-1 that is coupled to at least one of the first transformer 502-1 or the second portion 302-2 of the amplifier 136. In some cases, a controller 602 may use a first control signal 604-1 to engage a bias switch BS that is coupled to at least one of the transformer T1 or the second amplifier transistor M2. This engaging may include biasing the second amplifier transistor M2 into an analog operational mode by coupling a gate terminal thereof to a diode-level bias voltage.

At block 1108, responsive to the engagement, the first signal is amplified, by the second portion of the amplifier, to produce a partially-amplified signal. For example, responsive to the engagement of the first switch component 504-1, the electronic device 102 can amplify, using the second portion 302-2 of the amplifier 136, the first signal 410-1 to produce a partially-amplified signal 608. For instance, responsive to the biasing, the second amplifier transistor M2 may amplify the first signal 410-1, which is provided to the gate terminal thereof, to produce the partially-amplified signal 608 at a drain terminal of the second amplifier transistor M2.

At block 1110, the partially-amplified signal is routed from the second portion of the amplifier, over a first signal path of a switch matrix, to a first portion of the amplifier. For example, the electronic device 102 can route the partially-amplified signal 608 from the second portion 302-2 of the amplifier 136, over a first signal path 402-1 of a switch matrix 132, to a first portion 302-1 of the amplifier 136. To do so, the analog-biased second amplifier transistor M2 may be enabled to forward the partially-amplified signal 608 from the drain terminal thereof over the first signal path 402-1 of the switch matrix 132 to a source terminal of a first amplifier transistor M1.

At block 1112, the partially-amplified signal is amplified, by the first portion of the amplifier, to produce an amplified signal. For example, the electronic device 102 can amplify, using the first portion 302-1 of the amplifier 136, the partially-amplified signal 608 to produce an amplified signal 512. Here, the first amplifier transistor M1 may amplify the partially-amplified signal 608 to produce the amplified signal 512 at a drain terminal thereof. In some cases, the first amplifier transistor M1 and the second amplifier transistor M2 may be arranged to operate as a cascode amplifier across the switch matrix 132. Further, the first amplifier transistor M1 and the second amplifier transistor M2 may be coupled together in series between a first power distribution node 702-1 and a second power distribution node 702-2 such that a same current (e.g., a DC current I-DC) flows through both amplifier transistors to conserve power.

In some implementations, a process can further entail processing a signal with a second port interface 130-2. For example, such a process can include accepting a second signal 410-2 at a second transformer 502-2 and engaging a second switch component 504-2 that is coupled to the second transformer 502-2. The process can also include, responsive to the engaging, routing the second signal 410-2 from the second transformer 502-2, over a second signal path 402-2 of the switch matrix 132, to the first portion 302-1 of the amplifier 136. The process can further include amplifying, by the first portion 302-1 of the amplifier 136, the second signal 410-2 to produce another amplified signal 512.

Additionally, a process can entail controlling which port interface 130 is activated based on a frequency of a received signal. For example, such a process can include performing the engaging of the first switch component 504-1 based on a first frequency (e.g., a first instance of the frequency 606) of the first signal 410-1 and a first frequency band 404-1 corresponding to the first transformer 502-1. The process can also include performing the engaging of the second switch component 504-2 based on a second frequency (e.g., a second instance of the frequency 606) of the second signal 410-2 and a second frequency band 404-2 corresponding to the second transformer 502-2.

Additionally or alternatively, a signal being processed may be routed to a different downlink pipe 134 using a different first switch component 504-1 and a different second portion 302-2 of the first port interface 130-1. For example, a process may include accepting another first signal 410-1 at the first transformer 502-1 and routing the other first signal 410-1 from the first transformer 502-1 to another second portion 302-2 of another amplifier 136. The process may also include engaging another first switch component 504-1 that is coupled to at least one of the first transformer 502-1 and the other second portion 302-2 of the other amplifier 136. Responsive to the engaging, the process may additionally include amplifying, by the other second portion 302-2 of the other amplifier 136, the other first signal 410-1 to produce another partially-amplified signal 608. The process may also include routing the other partially-amplified signal 608 from the other second portion 302-2 of the other amplifier 136, over another first signal path 402-1 of the switch matrix 132, to another first portion 302-1 of the other amplifier 136 that is part of a different downlink pipe 134. The process may further include amplifying, by the other first portion 302-1 of the other amplifier 136, the other partially-amplified signal 608 to produce another amplified signal 512 at the different downlink pipe 134.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A mobile device for processing a signal, the mobile device comprising:
a first portion of an amplifier;
a first receive port interface comprising:
a first transformer;
a second portion of the amplifier, the second portion of the amplifier coupled to the first transformer; and
a first switch component coupled to at least one of the first transformer or the second portion of the amplifier;
a second receive port interface comprising:
a second transformer; and
a second switch component coupled to the second transformer; and
a switch matrix, the switch matrix coupled between:
the first switch component and the first portion of the amplifier;
the second switch component and the first portion of the amplifier; and
the second portion of the amplifier and the first portion of the amplifier.

2. The mobile device of claim 1, wherein the switch matrix comprises multiple signal paths configured to enable the first receive port interface or the second receive port interface to be operatively connected to the first portion of the amplifier responsive to engagement of the first switch component or the second switch component, respectively.

3. The mobile device of claim 1, wherein:
the first portion of the amplifier comprises a first amplifier transistor;
the second portion of the amplifier comprises a second amplifier transistor; and
the switch matrix comprises a signal path coupled between the first amplifier transistor and the second amplifier transistor.

4. The mobile device of claim 3, further comprising:
a first power distribution node; and
a second power distribution node,
wherein the first amplifier transistor and the second amplifier transistor are coupled together in series between the first power distribution node and the second power distribution node.

5. The mobile device of claim 4, wherein the first amplifier transistor, the switch matrix, and the second amplifier transistor are configured to:
enable a direct-current current (DC current) to flow between the first power distribution node and the second power distribution node; and
enable the DC current to flow through the first amplifier transistor, the signal path of the switch matrix, and the second amplifier transistor.

6. The mobile device of claim 3, wherein:
the signal path of the switch matrix includes a first end and a second end;
the first amplifier transistor comprises a channel terminal, the channel terminal of the first amplifier transistor coupled to the first end of the signal path; and
the second amplifier transistor comprises a channel terminal and a gate terminal, the gate terminal coupled to the first transformer, the channel terminal of the second amplifier transistor coupled to the second end of the signal path.

7. The mobile device of claim 6, wherein:
the signal path of the switch matrix comprises a first signal path;
the switch matrix comprises a second signal path;
the first switch component comprises a first switch transistor, the first switch transistor coupled between the gate terminal of the second amplifier transistor and at least one bias voltage node; and
the second switch component comprises a second switch transistor, the second switch transistor comprising a first channel terminal and a second channel terminal, the first channel terminal coupled to the second signal path of the switch matrix, the second channel terminal coupled to the second transformer.

8. The mobile device of claim 1, wherein:
the first switch component is configured, responsive to being in an engaged state, to enable a first signal propagation path from the first transformer, through the second portion of the amplifier, across the switch matrix, and to the first portion of the amplifier; and
the second switch component is configured, responsive to being in the engaged state, to enable a second signal propagation path from the second transformer, across the switch matrix, and to the first portion of the amplifier.

9. The mobile device of claim 8, wherein:
the amplifier is configured, responsive to the first switch component being in the engaged state, as a multi-stage amplifier comprising the first portion of the amplifier and the second portion of the amplifier; and
the amplifier is configured, responsive to the second switch component being in the engaged state, as a single-stage amplifier comprising the first portion of the amplifier.

10. The mobile device of claim 8, wherein:
responsive to the first switch component being in the engaged state, the second portion of the amplifier comprises a main stage of the amplifier, and the first portion of the amplifier comprises a cascode stage of the amplifier.

11. The mobile device of claim 10, wherein:
the first portion of the amplifier comprises a cross-coupled differential amplifier; and
the second portion of the amplifier comprises a common-source differential amplifier.

12. The mobile device of claim 11, wherein:
the cross-coupled differential amplifier comprises a complementary metal-oxide-semiconductor (CMOS) cross-coupled differential amplifier; and
the common-source differential amplifier comprises a CMOS common-source differential amplifier.

13. The mobile device of claim 1, wherein:
the first receive port interface corresponds to a first frequency band;
the second receive port interface corresponds to a second frequency band; and
the mobile device further comprises a controller coupled to the first switch component and to the second switch component, the controller configured to selectively activate the first receive port interface or the second receive port interface using the first switch component or the second switch component, respectively, based on a frequency of a received signal, the first frequency band, and the second frequency band.

14. The mobile device of claim 1, wherein:
the second receive port interface comprises another second portion of the amplifier, the another second portion of the amplifier coupled to the second transformer;
the second switch component is coupled to the second transformer and the another second portion of the amplifier;

the switch matrix is coupled between the another second portion of the amplifier and the first portion of the amplifier;
the first switch component is configured, responsive to being in an engaged state, to enable a first signal propagation path from the first transformer, through the second portion of the amplifier, across the switch matrix, and to the first portion of the amplifier; and
the second switch component is configured, responsive to being in the engaged state, to enable a second signal propagation path from the second transformer, through the another second portion of the amplifier, across the switch matrix, and to the first portion of the amplifier.

15. The mobile device of claim 1, further comprising:
a third receive port interface comprising:
  a third transformer;
  another second portion of the amplifier, the another second portion of the amplifier coupled to the third transformer; and
  a third switch component coupled to at least one of the third transformer or the another second portion of the amplifier, wherein the switch matrix is coupled between:
    the third switch component and the first portion of the amplifier; and
    the another second portion of the amplifier and the first portion of the amplifier.

16. The mobile device of claim 1, further comprising:
a mixer comprising a mixer input node and a mixer output node, the mixer input node coupled to the first portion of the amplifier; and
a filter comprising a filter input node, the filter input node coupled to the mixer output node.

17. The mobile device of claim 16, wherein:
the first transformer is configured to process signals of a first frequency band;
the second transformer is configured to process signals of a second frequency band; and
the first portion of the amplifier, the mixer, and the filter are configured to process signals of both the first frequency band and the second frequency band.

18. The mobile device of claim 16, further comprising:
an antenna coupled to the first receive port interface and the second receive port interface; and
a wireless interface device coupled to the antenna, the wireless interface device comprising the first receive port interface, the second receive port interface, the switch matrix, the first portion of the amplifier, the mixer, and the filter.

19. The mobile device of claim 18, further comprising:
a display screen; and
a processor operatively coupled to the display screen and at least a portion of the wireless interface device, the processor configured to present one or more graphical images on the display screen based on wireless signals received using the antenna and the wireless interface device, including using the switch matrix and at least one of the first receive port interface or the second receive port interface.

20. The mobile device of claim 1, wherein:
the switch matrix is configured to switchably couple the first portion of the amplifier and the second portion of the amplifier in series between a first power distribution node and a second power distribution node.

21. A mobile device for processing a signal, the mobile device comprising:

first amplification means for amplifying the signal;
a first receive port interface comprising:
  a first transformer;
  second amplification means for amplifying the signal, the second amplification means coupled to the first transformer; and
  first activation means for activating the first receive port interface;
a second receive port interface comprising:
  a second transformer; and
  second activation means for activating the second receive port interface; and
matrix means for providing signal paths that couple the first receive port interface and the second receive port interface to the first amplification means.

22. The mobile device of claim 21, wherein:
the first activation means comprises means for establishing a first signal propagation path for the signal between the first transformer and the first amplification means, the first signal propagation path comprising the second amplification means, a first signal path of the matrix means, and the first amplification means; and
the second activation means comprises means for establishing a second signal propagation path for the signal between the second transformer and the first amplification means, the second signal propagation path comprising a second signal path of the matrix means and the first amplification means.

23. The mobile device of claim 21, further comprising:
control means for selectively engaging the first activation means or the second activation means based on:
  a frequency of the signal to be processed,
  a first frequency band corresponding to the first receive port interface, and
  a second frequency band corresponding to the second receive port interface.

24. The mobile device of claim 21, wherein the first receive port interface comprises:
means for bypassing the second amplification means.

25. A method for processing signals, the method comprising:
accepting a first signal at a first transformer;
routing the first signal from the first transformer to a second portion of an amplifier, the second portion of the amplifier comprising a second amplifier transistor;
engaging a first switch component that is coupled to at least one of the first transformer or the second portion of the amplifier to bias the second amplifier transistor into an analog operational mode using the first switch component;
responsive to the engaging, amplifying, by the second portion of the amplifier, the first signal to produce a partially-amplified signal;
routing the partially-amplified signal from the second portion of the amplifier, over a first signal path of a switch matrix, to a first portion of the amplifier, the first portion of the amplifier comprising a first amplifier transistor; and
amplifying, by the first portion of the amplifier, the partially-amplified signal to produce an amplified signal,
the first amplifier transistor and the second amplifier transistor coupled together in series between a first power distribution node and a second power distribution node.

26. The method of claim 25, further comprising:
accepting a second signal at a second transformer;
engaging a second switch component that is coupled to the second transformer;
responsive to the engaging, routing the second signal from the second transformer, over a second signal path of the switch matrix, to the first portion of the amplifier; and
amplifying, by the first portion of the amplifier, the second signal to produce another amplified signal.

27. The method of claim 26, further comprising:
performing the engaging of the first switch component based on a first frequency of the first signal and a first frequency band corresponding to the first transformer; and
performing the engaging of the second switch component based on a second frequency of the second signal and a second frequency band corresponding to the second transformer.

28. An apparatus for processing a signal, the apparatus comprising:
multiple downlink pipes, each respective downlink pipe of the multiple downlink pipes respectively comprising a first portion of an amplifier;
a first port interface comprising:
    a first transformer;
    a second portion of a respective amplifier of a downlink pipe of the multiple downlink pipes, the second portion of the respective amplifier coupled to the first transformer;
    a first switch component coupled to the second portion of the respective amplifier;
    another second portion of another respective amplifier of another downlink pipe of the multiple downlink pipes, the another second portion of the another respective amplifier coupled to the first transformer; and
    another first switch component coupled to the another second portion of the another respective amplifier; and
a switch matrix, the switch matrix switchably coupling:
    the second portion of the respective amplifier to the first portion of the respective amplifier of the downlink pipe of the multiple downlink pipes to couple the second portion of the respective amplifier and the first portion of the respective amplifier of the downlink pipe together in series between a first power distribution node and a second power distribution node; and
    the another second portion of the another respective amplifier to the first portion of the another respective amplifier of the another downlink pipe of the multiple downlink pipes to couple the another second portion of the another respective amplifier and the first portion of the another respective amplifier of the another downlink pipe together in series between the first power distribution node and the second power distribution node.

29. The apparatus of claim 28, wherein each respective downlink pipe of the multiple downlink pipes comprises:
a mixer coupled to the first portion of the amplifier of the respective downlink pipe; and
a filter coupled to the mixer.

30. The apparatus of claim 28, further comprising:
a second port interface comprising:
    a second transformer; and
    a second switch component coupled to the second transformer,
wherein the switch matrix switchably couples the second switch component to the first portion of the respective amplifier of the downlink pipe of the multiple downlink pipes.

* * * * *